US008157344B2

(12) United States Patent
Kondo

(10) Patent No.: US 8,157,344 B2
(45) Date of Patent: Apr. 17, 2012

(54) INK CARTRIDGE-ATTACHING DEVICE AND INK JET RECORDING APPARATUS

(75) Inventor: Hirofumi Kondo, Tajimi (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 93 days.

(21) Appl. No.: 12/397,124

(22) Filed: Mar. 3, 2009

(65) Prior Publication Data

US 2009/0219310 A1 Sep. 3, 2009

(30) Foreign Application Priority Data

Mar. 3, 2008 (JP) ................................ 2008-051992

(51) Int. Cl.
*B41J 29/393* (2006.01)
*B41J 2/175* (2006.01)
*H01L 31/12* (2006.01)

(52) U.S. Cl. .............................. 347/19; 347/85; 257/80

(58) Field of Classification Search ..................... 347/19
See application file for complete search history.

(56) References Cited

U.S. PATENT DOCUMENTS

| | | | | |
|---|---|---|---|---|
| 6,619,776 | B2 | 9/2003 | Yoshiyama et al. | |
| 6,916,076 | B2 | 7/2005 | Yoshiyama et al. | |
| 2005/0219303 | A1 * | 10/2005 | Matsumoto et al. | 347/19 |
| 2006/0290722 | A1 * | 12/2006 | Kitagawa et al. | 347/86 |
| 2007/0070148 | A1 | 3/2007 | Hattori et al. | |
| 2007/0115314 | A1 * | 5/2007 | Kondo et al. | 347/19 |

FOREIGN PATENT DOCUMENTS

| | | | | |
|---|---|---|---|---|
| JP | 60042879 | A | * | 3/1985 |
| JP | S61-031264 | A | | 2/1986 |
| JP | 11074331 | A | * | 3/1999 |
| JP | 2002-292892 | A | | 10/2002 |
| JP | 2003-311937 | A | | 11/2003 |
| JP | 2005026546 | A | * | 1/2005 |
| JP | 2005-305940 | A | | 11/2005 |
| JP | 2007-196650 | A | | 8/2007 |

OTHER PUBLICATIONS

Machine generated English translation of JP document 11-074331 A to Hamada et al.; obtained via http://www19.ipdl.inpit.go.jp/PA1/cgi-bin/PA1INIT?1286457933782 on Oct. 6, 2010, 6 pp.*

Japan Patent Office; Notice of Reasons for Rejection in Japanese Patent Application No. 2008-051992 (counterpart to the above-captioned U.S. patent application) mailed Apr. 20, 2010.

* cited by examiner

*Primary Examiner* — Shelby Fidler
(74) *Attorney, Agent, or Firm* — Baker Botts L.L.P.

(57) ABSTRACT

An ink cartridge-attaching device includes a cartridge attachment section to which cartridges each storing an ink are attachable. Optical sensors are provided on the cartridge attachment section, which detect the cartridges attached to the cartridge attachment section, and each of which has light-emitting portion and light-receiving portion. The device further includes a controller which controls the optical sensors to obtain, based on signals from the optical sensors, information about the cartridges. The optical sensors are disposed such that the light-emitting portion and the light-receiving portion of the optical sensors are arranged alternately in a row. Light emitted from the light-emitting portion included in a certain optical sensor among the optical sensors is received by the light-receiving portion included in the certain optical sensor and received by another light-receiving portion adjacent to the light-emitting portion and included in another optical sensor, among the optical sensors, adjacent to the certain optical sensor.

7 Claims, 25 Drawing Sheets

INK CARTRIDGE-ATTACHING DEVICE AND INK JET RECORDING APPARATUS

CROSS REFERENCE TO RELATED APPLICATION

The present application claims priority from Japanese Patent Application No. 2008-051992, which was filed on Mar. 3, 2008, the disclosure of which is herein incorporated by reference in its entirety.

BACKGROUND OF THE INVENTION

1. Field of the Invention

The present invention relates to an ink cartridge-attaching device capable of detecting degradation of an optical sensor which detects a cartridge attached to a cartridge attachment section.

2. Description of the Related Art

Conventionally, there are widely known ink-jet recording apparatuses each of which records an image and/or a letter on a recording paper by jetting ink from a recording head onto the recording paper. A cartridge storing the ink can be attached to the recording apparatus, and the ink supplied from the cartridge is jetted from the recording head. In a case that a remaining amount of the ink remaining in the cartridge (ink remaining amount) becomes relatively small, the cartridge is removed from the recording apparatus and a new cartridge filled with the ink is attached to the recording apparatus, whereby image recording can be continued to be performed.

Among the ink-jet recording apparatuses, there is an ink-jet recording apparatus including an optical sensor which detects the ink remaining amount in a cartridge attached to the recording apparatus (see, for example, United States Patent Application Publication No. 2007/0070148 corresponding to Japanese Patent Application Laid-open No. 2007-196650). The optical sensor is provided with a light-emitter and a light-receiver, wherein the light emitter emits light toward a portion to be detected (detection-objective portion) of a cartridge attached to a predetermined cartridge attachment section and the light-receiver receives the light via the detection-objective portion; and based on a state of the light reception by the light-receiver, the information about the ink remaining amount in the cartridge can be detected. More specifically, the detection-objective portion of the cartridge shields the light when the ink remaining amount is not less than a predetermined amount, whereas the detection-objective portion allows the light pass therethrough when the ink remaining amount is less than the predetermined amount. Further, the optical sensor is constructed so as to output a signal indicating that the ink remaining amount is less than the predetermined value when the light from the light-emitter passes through the detection-objective portion and the light having a predetermined brightness or luminance is received by the light-receiver in a state that the cartridge is attached.

Generally, in the optical sensor, a light-emitting diode and a photo diode are used as a light-emitting element and a light-receiving element, respectively. In particular, the light-emitting diode has a characteristic that the light-emitting diode is deteriorated as the operating time passes such that illuminance or brightness of the light-emitting diode during the operation is lowered. Further, in order to detect the ink remaining amount as described above, the optical sensor needs to be operated for a long period of time in a state that the cartridge is attached. Therefore, it is preferable that the degradation state of the optical sensor can be grasped in the state that the cartridge is attached. However, in the cartridge as described above having the detection-objective portion which shields the light from the light-emitter when the ink remaining amount is not less than the predetermined amount, it is difficult to correctly determine whether or not a state that the light-receiver does not receive a light having a predetermined luminance is due to the ink remaining amount being not less than the predetermined amount or due to the lowering of illuminance caused by the degradation of the light-emitter.

SUMMARY OF THE INVENTION

An object of the invention is to provide an ink cartridge-attaching device capable of correctly detecting the degradation of an optical sensor, which detects information about a cartridge, even in a state that the cartridge is attached to the cartridge attachment section and an ink-jet recording apparatus.

According to the first aspect of the present invention, there is provided an ink cartridge-attaching device, including: a cartridge attachment section to which a plurality of cartridges each storing an ink are attachable; a plurality of optical sensors which are provided on the cartridge attachment section, which detect the cartridges attached to the cartridge attachment section respectively, and which have light-emitting portions and light-receiving portions, each of the optical sensors having a light-emitting portion of the light-emitting portions and a light-receiving portion of the light-receiving portions; and a controller which controls the optical sensors to obtain, based on signals from the optical sensors, information about the cartridges; and the optical sensors are disposed such that the light-emitting portions and the light-receiving portions are arranged alternately in a row; and light emitted from a light-emitting portion included in a certain optical sensor among the optical sensors is received by a light-receiving portion included in the certain optical sensor and received by another light-receiving portion adjacent to the light-emitting portion and included in another optical sensor, among the optical sensors, adjacent to the certain optical sensor. In the ink cartridge-attaching device according to the present invention, the controller may obtain information about a cartridge, among the cartridges, detected by the certain optical sensor based on a signal which the light-receiving portion of the certain optical sensor outputs by receiving the light from the light-emitting portion of the certain optical sensor; and the controller may obtain information about degradation of another light-emitting portion included in still another optical sensor adjacent to the certain optical sensor and adjacent to the light-receiving portion, based on a signal which the light-receiving portion of the certain optical sensor outputs by receiving the light from the another light-emitting portion.

In this case, the light from a light-emitting portion belonging to the certain optical sensor is received by the another light-receiving portion which is adjacent to the light-emitting portion and belonging to the another optical sensor adjacent to the certain optical sensor. With this, it is possible to detect the information about the degradation of the light-emitting portion of the certain optical sensor, regardless of whether or not the cartridge corresponding to the certain optical sensor is attached to the cartridge-attachment section, by receiving the light emitted from the light-emitting portion included in the certain optical sensor at the another light-receiving portion adjacent to the light-emitting portion and included in the another optical sensor, in a state that any intervening object does not substantially exist between the light-emitting portion and the another light-receiving portion. Note that the term "information about each of the cartridges (information about the cartridges)" is a concept encompassing information whether or not the cartridge is attached to the cartridge-attachment section; information regarding a type of the cartridge attached to the cartridge-attachment section (to be explained later); and information about a remaining amount of the ink stored in the cartridge.

According to the second aspect of the present invention, there is provided an ink jet recording apparatus which jets liquid droplets of ink and records images on a recording medium, including: an ink jet head which jets liquid droplets of ink; a recording medium transporting mechanism which transports the recording medium; and the ink cartridge-attaching device as defined in the first aspect of the present invention.

BRIEF DESCRIPTION OF THE DRAWINGS

FIG. 18 is a cross sectional view schematically showing the attachment process in which the cartridge is being attached to the cartridge attachment section, illustrating a state that the cartridge has been fully attached to the accommodating casing, in;

DESCRIPTION OF THE PREFERRED EMBODIMENT

In the following, an explanation will be given about an ink cartridge-attaching device according to an embodiment of the present invention, as exemplified by an ink-jet recording apparatus (hereinafter referred to as "recording apparatus") provided with the ink cartridge-attaching device, with reference to the drawings.

Figure 1:
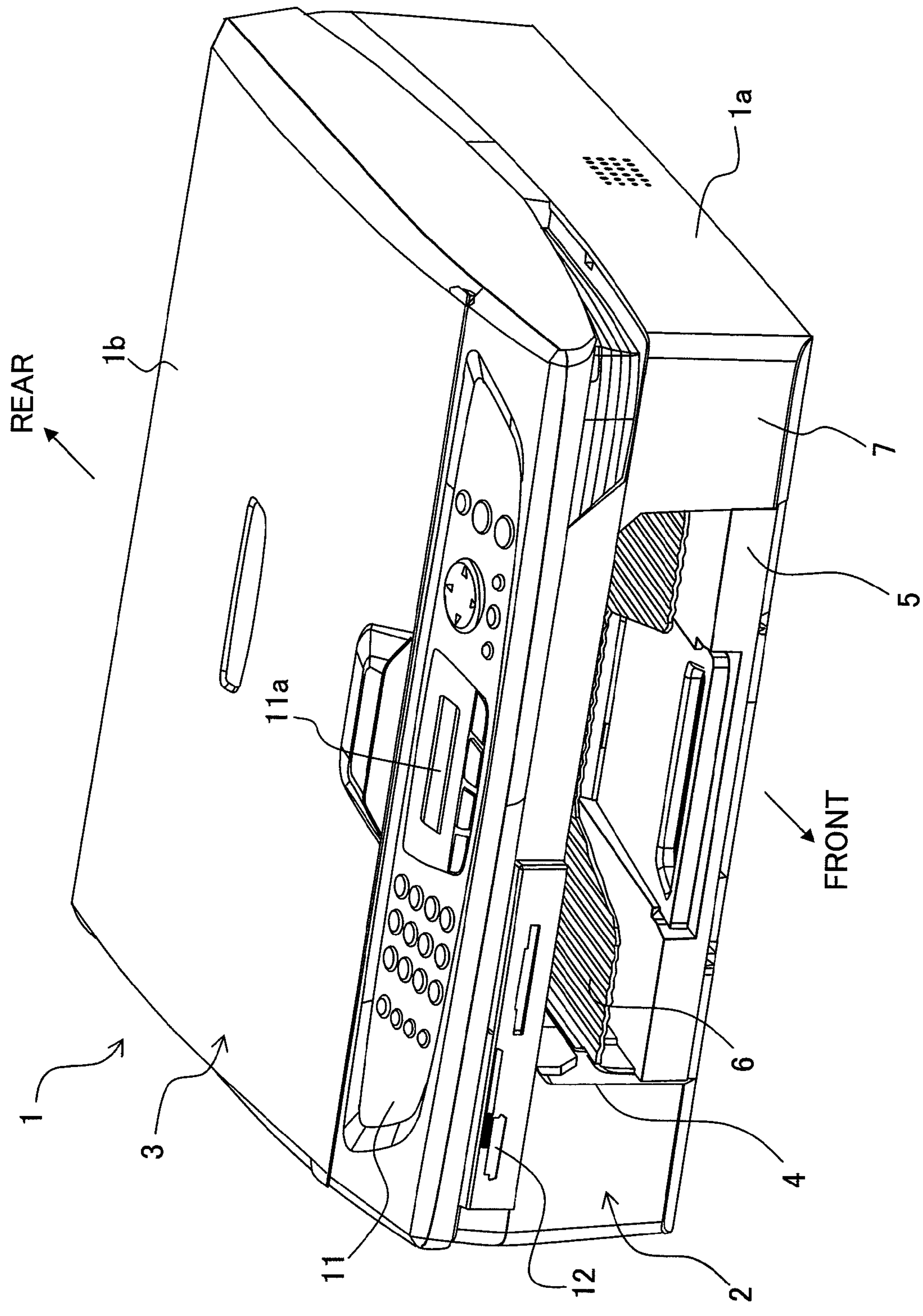
FIG. 1 is a perspective view showing the external construction of an recording apparatus to which the present invention is applied and showing, as an embodiment of recording apparatus, a so-called a multi-function apparatus having a printing function, a scanning function, a copying function and a facsimile function.

FIG. 1 is a perspective view of the external construction of a recording apparatus 1 to which the present invention is applied, and shows a so-called multi-function apparatus having a printing function, a scanning function, a copying function, a facsimile function, etc. as an embodiment of the recording apparatus 1. As shown in FIG. 1, the recording apparatus 1 is constructed to include: a casing 1*a* having a substantially rectangular parallelepiped shape; a printing section 2 of an ink-jet type which records an image and/or a letter on a recording paper as a recording medium and which is arranged at a lower portion of the casing 1*a*; and a scanning section 3 which is located at an upper portion of the casing 1*a*.

The printing section 2 of the recording apparatus 1 has an opening 4 in the front surface (forward side) of the casing 1*a*. In the opening 4, a paper feed tray 5 and a paper discharge tray 6 are arranged in a double-deck manner such that the paper discharge tray 6 is located above the paper feed tray 5. The paper feed tray 5 can accommodate a plurality of sheets of the recording paper as the recording objective. For example, the paper feed tray 5 can accommodate a plurality of various sizes of the recording paper which are not greater than A4 size.

A door 7 is openably/closably provided in the lower right portion in the front side of the printer section 2, and a cartridge attachment section 8 (see FIG. 2) is provided inside the door 7. Thus, when the door 7 is opened, the cartridge attachment section 8 is exposed to the front side such that cartridges 10 (see FIG. 2) can be attached (placed or mounted) or removed in the horizontal direction. The cartridge attachment section 8 is provided with an accommodating casing 9 (see FIG. 2) for the cartridges 10 corresponding to the colors of inks, respectively, used in the recording apparatus. This printing section 2 uses, for example, five color inks which are cyan (C), magenta (M), yellow (Y), photo black (PBk) dye inks and a black (Bk) pigment ink. Thus, the cartridge attachment section 8 is provided with the accommodating casing 9 of which internal space is partitioned into five space-sections. The cartridges 10 which storing the cyan (C), magenta (M), yellow (Y), photo black (PBk), and black inks (Bk) are accommodated in the five partitioned spaces, respectively.

The scanning section 3 arranged at the upper portion of the recording apparatus 1 is constructed as a so-called flatbed scanner. Namely, as shown in FIG. 1, a document cover 1*b* is openably/closably provided on the upper surface of the recording apparatus 1, and is provided as the top plate of the recording apparatus 1. Further, a platen glass on which a document is placed and an image sensor which reads an image and/or a letter of a document, etc. are arranged below or under the document cover 1*b*.

An operation panel 11 via which the printer section 2, the scanner section 3, etc. can be operated is arranged in the upper portion of the front side of the recording apparatus 1. The operation panel 11 is constructed of various operation buttons, a liquid crystal display 11*a* as an output section from which the information is outputted, etc. The recording apparatus 1 is operable based on an instruction outputted from the operation panel 11 as a result of an operation by the user via the operation panel 11. In a case that the recording apparatus 1 is connected to an external computer, the recording apparatus 1 is operable also based on an instruction transmitted from the computer via a printer driver or a scanner driver.

A slot 12 is arranged in the upper left portion in the front side of the ink-discharging apparatus 1. Various compact memory cards as storage media can be inserted into the slot 12. By performing a predetermined operation on the operation panel 11, data stored in the compact memory cards inserted into the slot 12 can be read out. Further, it is possible to display the read data on the liquid crystal display of the operation panel 11; and it is possible to record an arbitrarily selected image, based on the read date displayed on the liquid crystal display, on the recording paper by the printer section 2.

Figure 2:
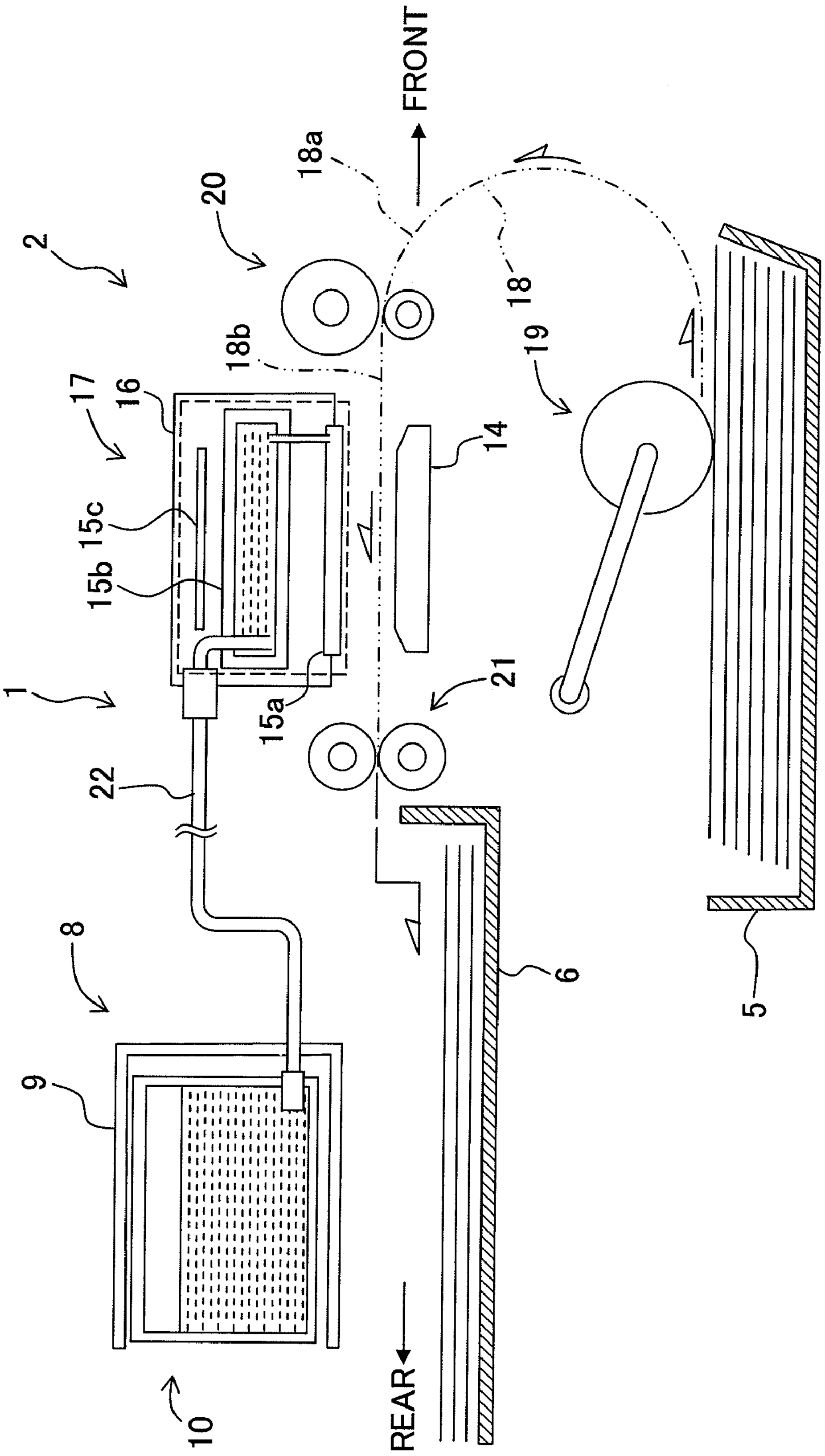
FIG. 2 is a cross sectional view schematically showing the construction of a printing section of the recording apparatus.

FIG. 2 is a schematic sectional view showing the construction of the printer section 2 provided on the recording apparatus 1. As shown in FIG. 2, the paper feed tray 5 is provided in the vicinity of the bottom portion of the ink-discharging apparatus 1, and a platen 14 which is plate-shaped and is long or elongated in the right-left direction in FIG. 1 is arranged above or over the paper feed tray 5. Further, an image recording unit 17 is provided above the platen 14. The image recording unit 17 includes a head unit 15*a* which discharges (jets) the ink from unillustrated nozzle holes; sub-tanks 15*b* via each of which one of the inks is supplied to the head unit 15*a*; a head control board 15*c* (for example, chip on film (COF)) which outputs, to the head unit 15*a*, a drive signal to be transmitted to an actuator electrically connected to the head unit 15*a*; and the like. The sub-tanks 15*b* provided on the image recording unit 17 are communicated with the cartridges 10, which are attached to the cartridge attachment section 8, via flexible tubes 22 respectively. Each of the sub-tanks 15*b* temporarily stores one of the inks supplied from one of the cartridges 10 and supplies one of the stored inks to the head unit 15*a*.

A paper transport path 18 is formed as extending from the rear portion of the paper feed tray 5. The paper transport path 18 includes a curved path 18*a* which is curved upwardly from the rear portion of the paper feed tray 5 and which further heads toward the front side of the recording apparatus 1; and a straight path 18*b* extending further toward the front side of the recording apparatus 1 from the terminal or end of the curved path 18*a*. The paper transport path 18 is constructed of an outer guide plane and an inner guide plane which face with each other at a predetermined distance, at portions of the paper transport path 18 which are different from an arranging position or place at which the image recording unit 17 is arranged.

A paper feed roller 19 which supplies (feeds) the recording paper in the paper feed tray 5 to the paper transport path 18 is provided immediately above the paper feed tray 5. In the vicinity of the downstream portion of the curved path 18*a* in the paper transport path 18, a pair of transport rollers 20 constructed of a transport roller and a transport-pinch roller are provided so as to sandwich the paper transport path 18 from above and below by the transport roller and the transport-pinch roller. Further, in the vicinity of the downstream portion of the straight path 18*b* in the paper transport path 18, a pair of paper discharge rollers 21 constructed of a paper discharge roller and a discharge-pinch roller are provided so as to sandwich the paper transport path 18 from above and below by the paper discharge roller and the discharge-pinch roller. The image recording unit 17 and the platen 14 as described above are provided so that the image recording head 17 and the platen 18 sandwich the straight path 18*b* from above and below, respectively, at a portion of the straight path 18*b* located between the pair of transport rollers 20 and the pair of paper discharge rollers 21.

Further, the image recording unit 17 is supported by an unillustrated guide rod extending in the right-left direction in FIG. 1 (the longitudinal direction of the platen 14) so that the image recording unit 17 is slidably movable in the right-left direction. Furthermore, the image recording unit 17 is connected to an unillustrated head driving mechanism constructed of a pulley, a belt, etc. Accordingly, by the drive of the head drive mechanism, the image recording unit 17 is capable of scanning within a predetermined range in the right-left direction in FIG. 1 along the guide rod.

According to such a printer section 2, the recording paper in the paper feed tray 5 is supplied to the paper transport path 18 by the paper feed roller 19, and then is transported on the transport path 18 from the curved path 18*a* to the straight path 18*b* by the pair of transport rollers 20. The recording paper arriving at the straight path 18*b* is subjected to image recording to have an image recorded on the recording paper with the ink discharged from the head unit 15*a* which is included in the image recording unit 17 and which is arranged to face the recording paper. When the recording is completed, the recording paper is discharged from the straight path 18*b* by the pair of paper discharge rollers 21, and then is accommodated by the discharged paper tray 6. The paper feed roller 19, the transport path 18, the transport rollers 20, and the paper discharge rollers 21 are included in the recording medium transporting mechanism of the present invention.

Figure 12A:
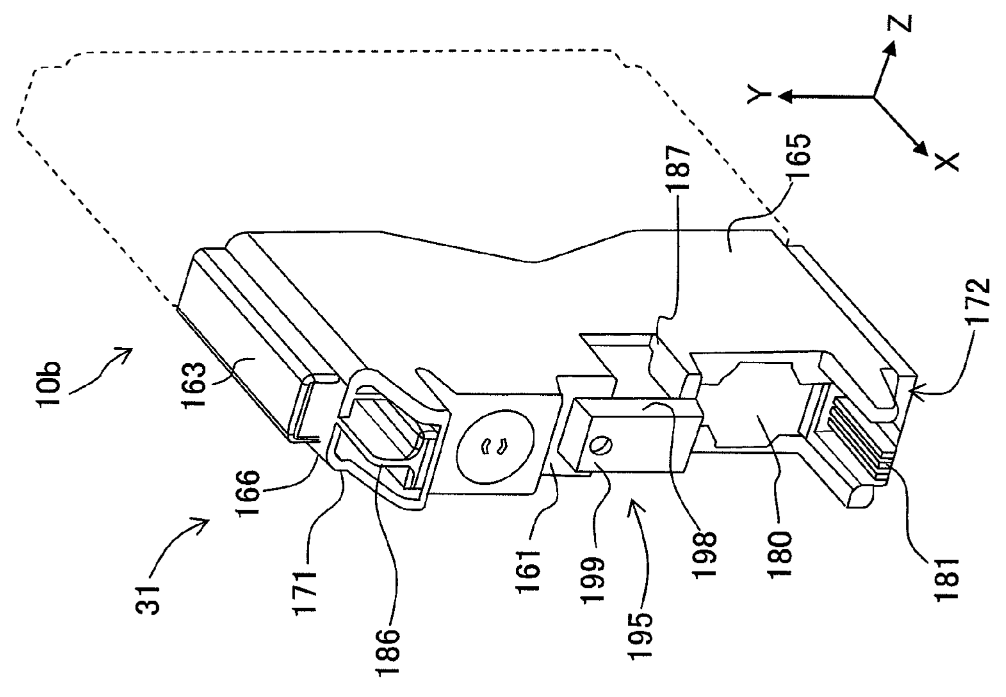
FIG. 12A is a perspective view showing the construction of another type of cartridge different from the cartridge shown in FIGS. 3A and 3B, with a front cover thereof shown in solid lines and the remaining portion other than the front portion shown in broken lines.
Figure 12B:
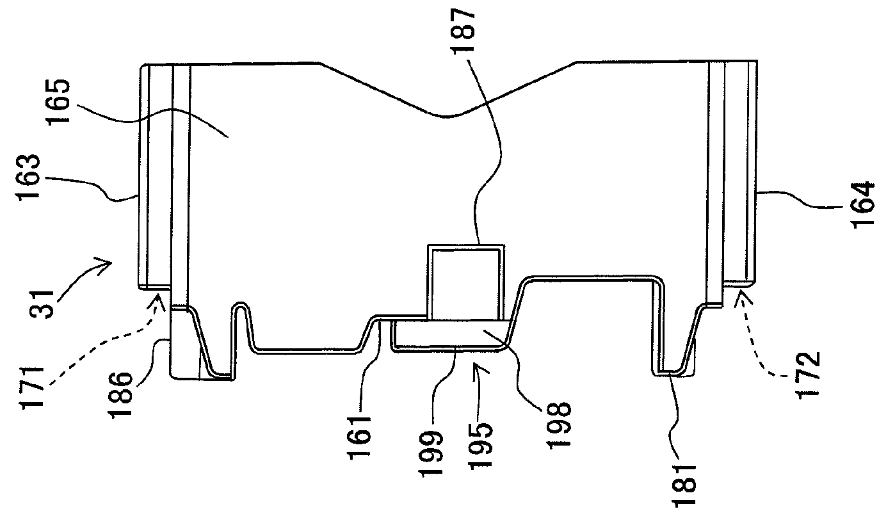
FIG. 12B is a side view of the front cover.

Meanwhile, there is a case that two types of the cartridges, which store an ink of the same color but of which ink-storage amounts of the ink are different from each other, are distributed on the market, such as a cartridge 10*a* (see FIGS. 3A and 3B) and a cartridge 10*b* (see FIGS. 12A and 12B). In this recording apparatus 1 according to the embodiment, the cartridges 10a, 10b are both constructed to be attachable to one piece of the accommodating casing 9 provided on the cartridge attachment section 8.

Figure 3B:
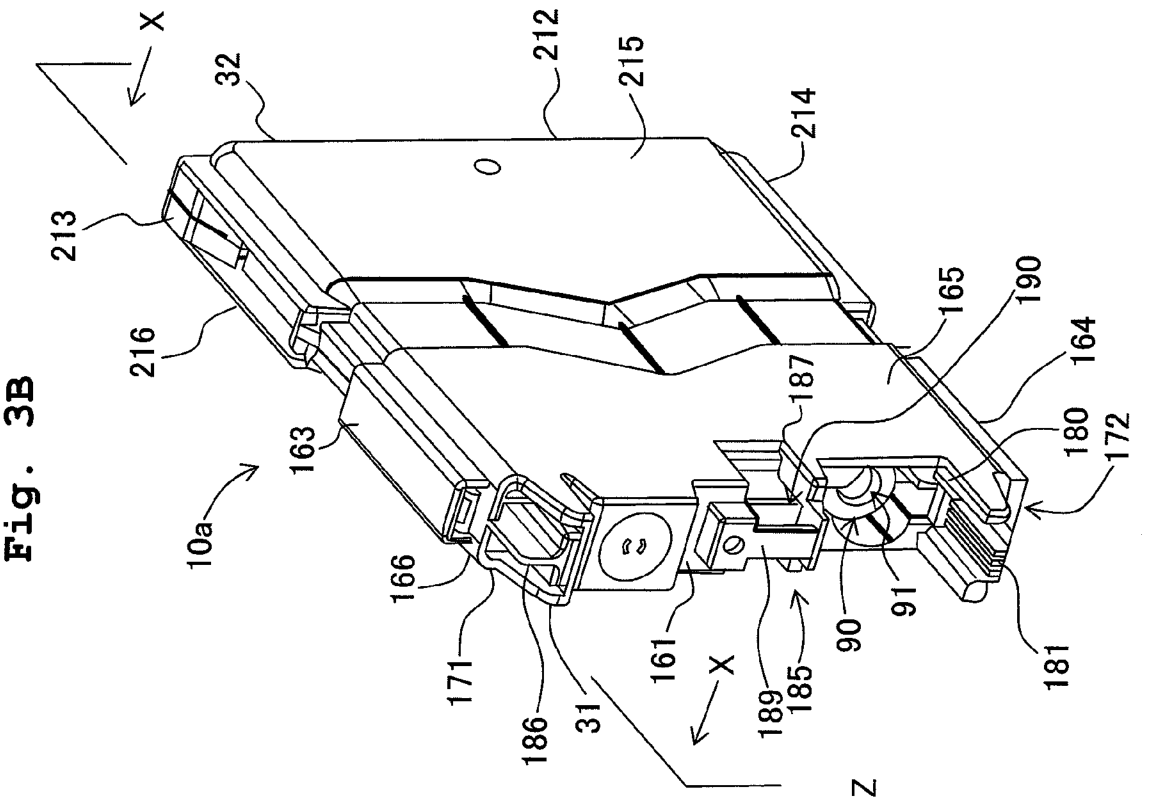
FIGS. 3A and 3B are perspective views each showing the external construction of a cartridge.
Figure 3A:
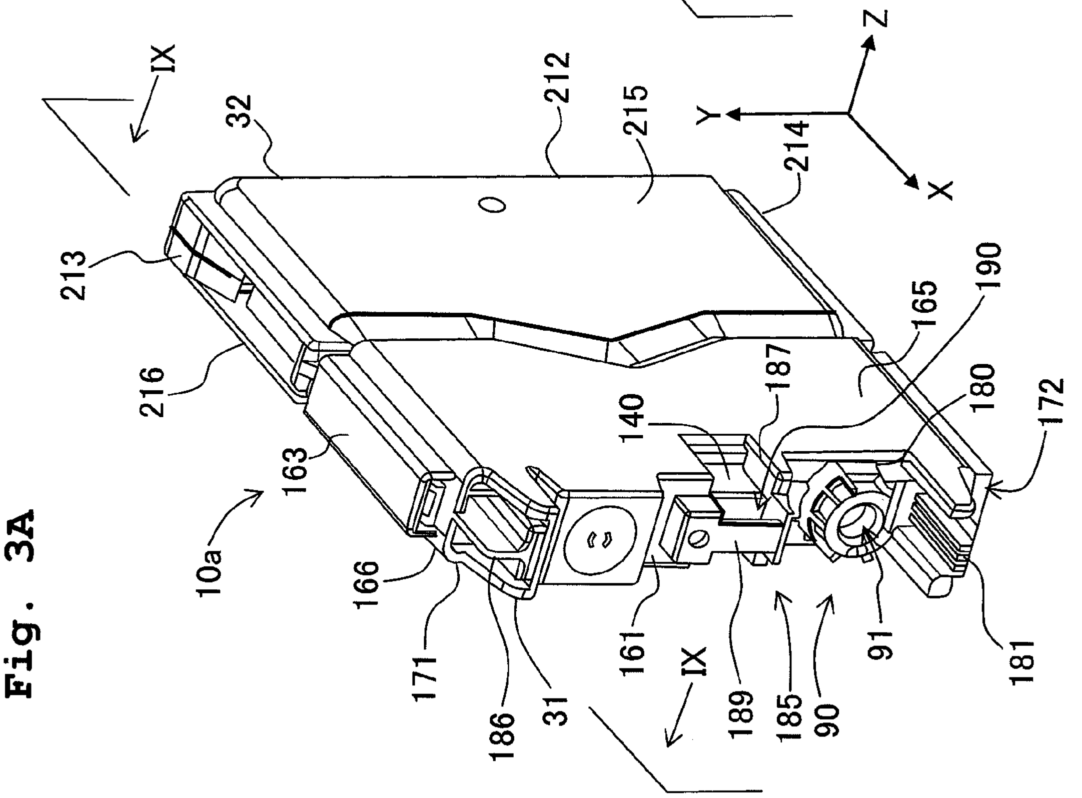
Figure 4A:
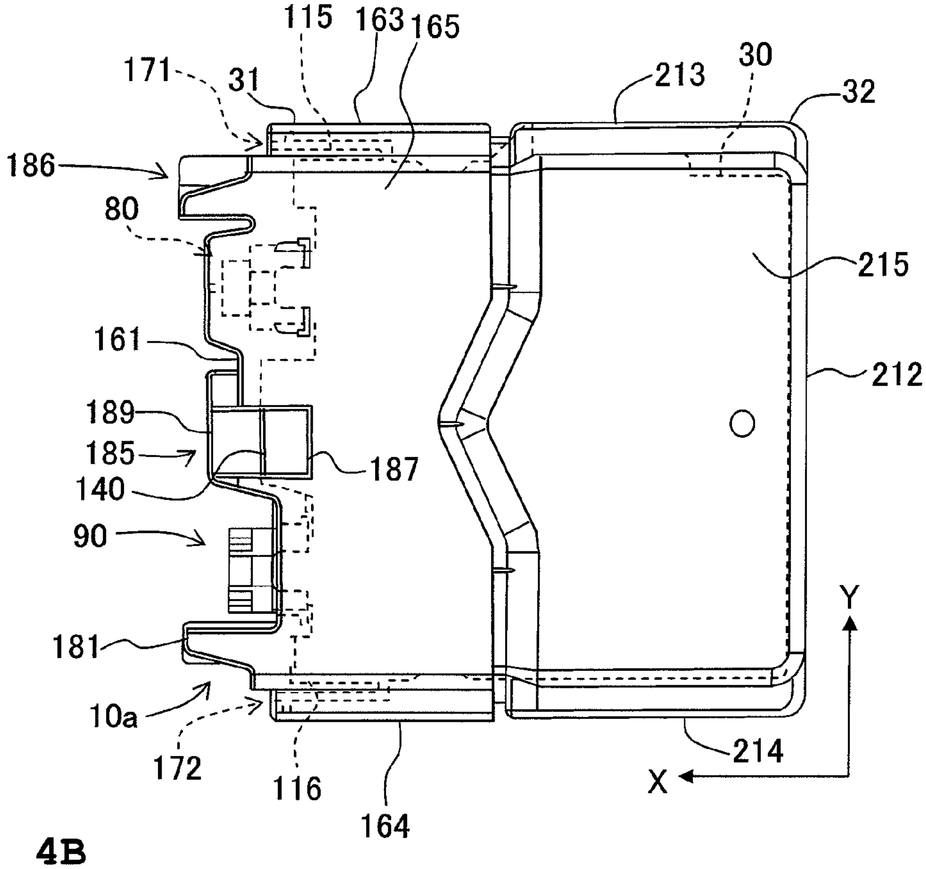
FIGS. 4A and 4B are side views showing the cartridge shown in FIGS. 3A, 3B.
Figure 4B:
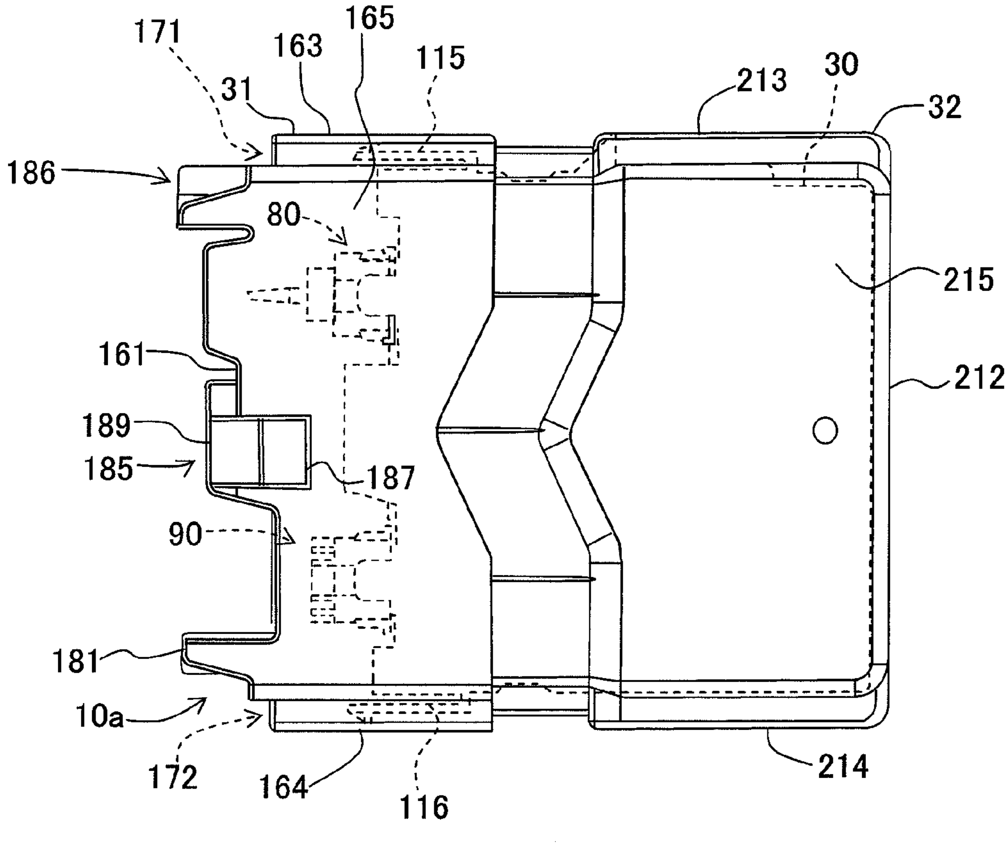

In the following, an explanation will be given about the construction of the cartridge 10a, as the one type of the cartridges, with reference to FIGS. 3 to 11. FIGS. 3A and 3B are perspective views each showing the external construction of the cartridge 10a, and FIGS. 4A and 4B are side views showing the cartridge 10a shown in FIGS. 3A and 3B, respectively. The cartridge 10a according to the embodiment is constructed to be extendable and contractable; FIGS. 3A and 4A each show a state that the cartridge 10a is contracted, while FIGS. 3B and 4B each show a state that the cartridge 10a is extended. Note that in the following explanation, the side in front of (front side of) the cartridge 10 in FIGS. 3A and 3B is regarded as the front portion (front) of the cartridge 10 and the side rear of (rear side of) the cartridge 10 in FIGS. 3A and 3B is regarded as the rear portion (rear) of the cartridge 10.

As shown in FIGS. 3A and 3B and FIGS. 4A and 4B, the cartridge 10a has a substantially flat hexahedron in the raised posture shown in FIGS. 3A and 3B and FIGS. 4A and 4B. The cartridge 10a has a rectangular parallelepiped shape having a relatively small width (in a direction indicated by "Z"; Z direction), and having a height (in a direction indicated by "Y"; Y direction) and a depth (in a direction indicated by "X"; X direction) which are greater than the width. The cartridge 10a is transported in the X direction to be attached to or mounted on the cartridge attachment section 8 while maintaining the raised posture. The cartridge 10a includes a cartridge body 30 (see FIGS. 4A and 4B) which stores the ink in an ink chamber 100 (see FIGS. 5A and 5B) formed in the cartridge body 30; a front cover 31 which covers a front portion 30a of the cartridge body 30; and a rear cover 32 which covers a rear portion 30b of the cartridge body 30. In this embodiment, each of the cartridge body 30, the front cover 31 and the rear cover 32 is formed of a resin material such as nylon, polyethylene, or polypropylene. In the following, an explanation will be made about the cartridge body 30, the front cover 31, and the rear cover 32 of the cartridge 10a in order.

Figure 5B:
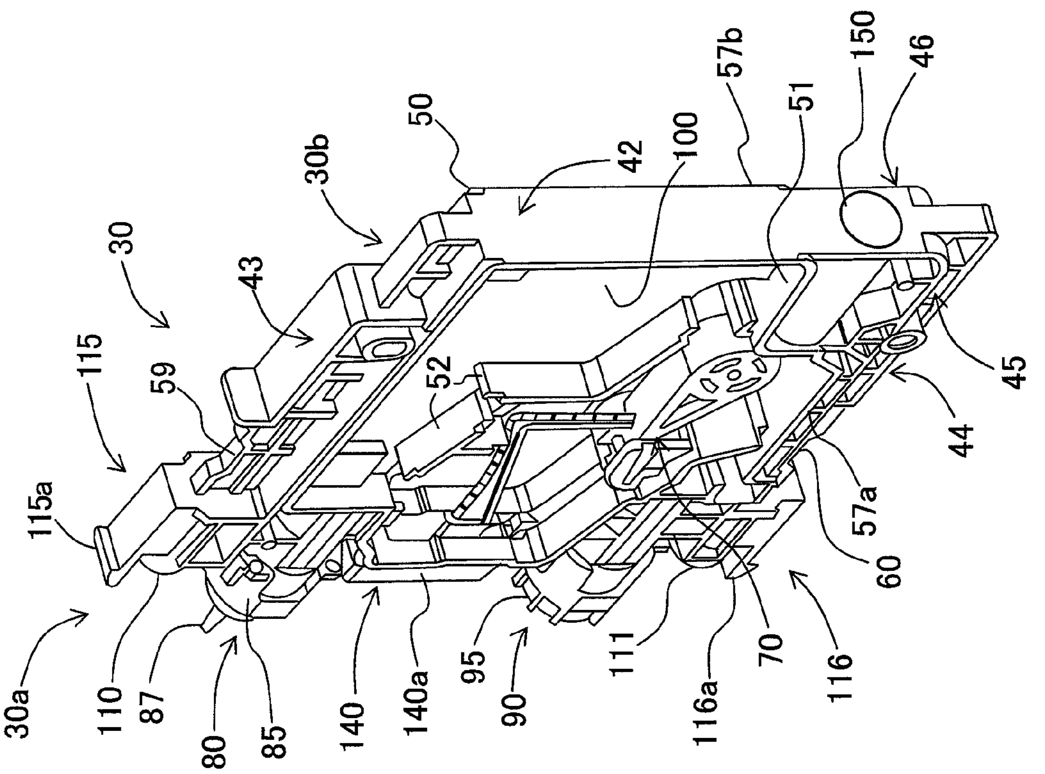
FIG. 5B is a perspective view showing the external construction of the cartridge body, seen obliquely from the rear.
Figure 5A:
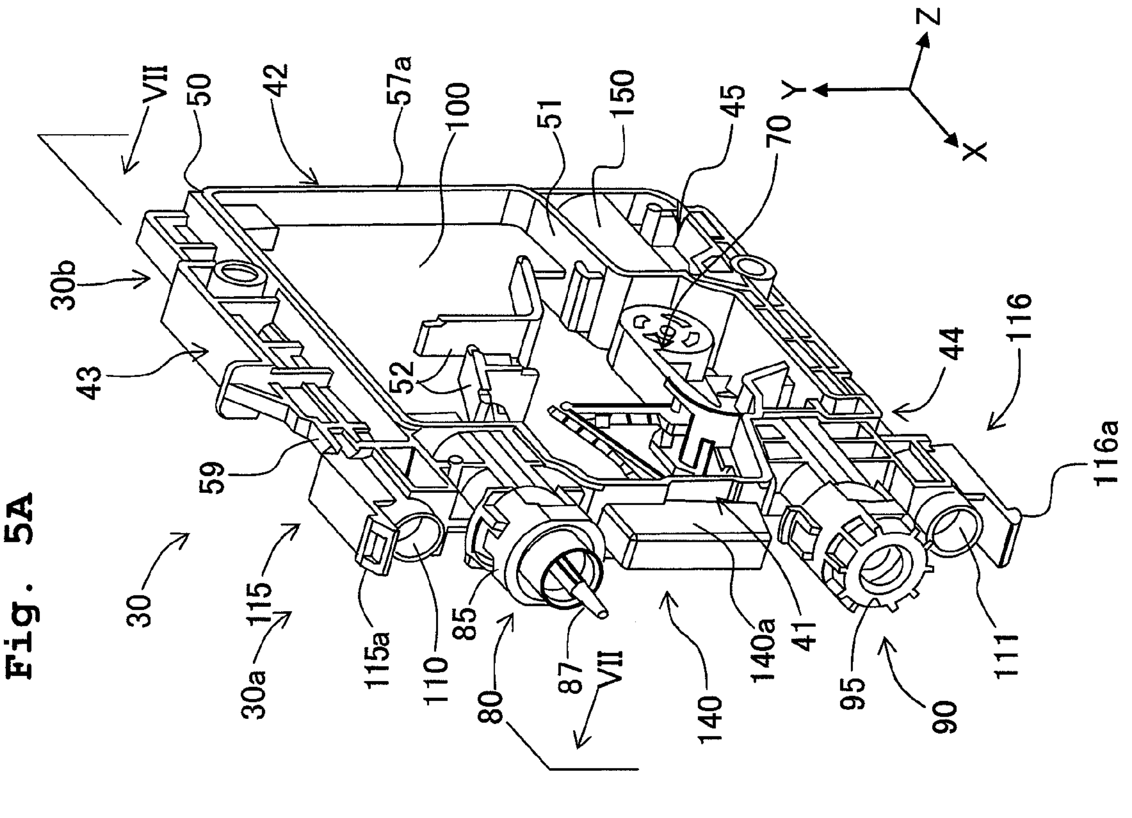
FIG. 5A is a perspective view showing the external construction of the body of the cartridge (cartridge body), seen obliquely from the front.
Figure 6:
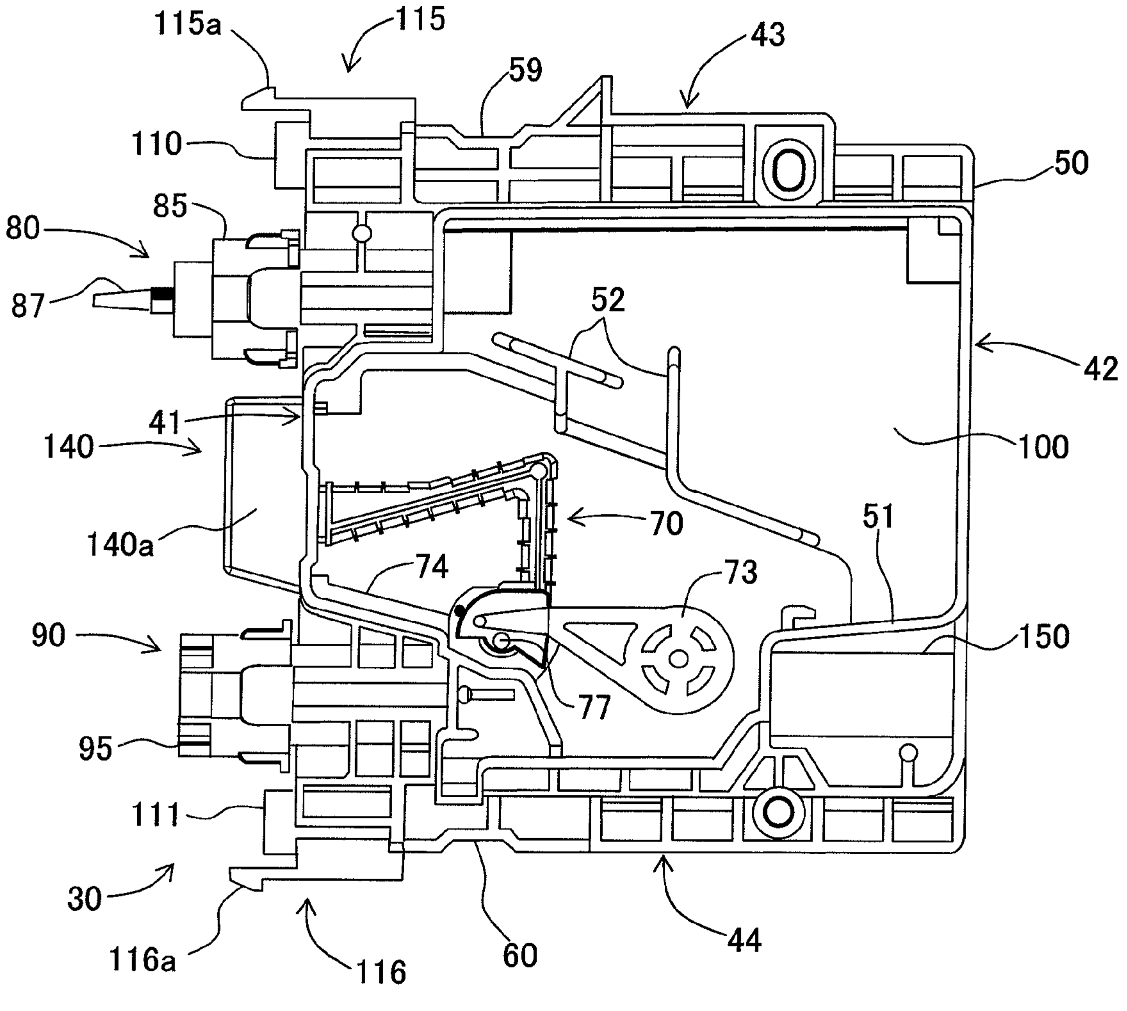
FIG. 6 is a side view of the cartridge body shown in FIG. 5.
Figure 7:
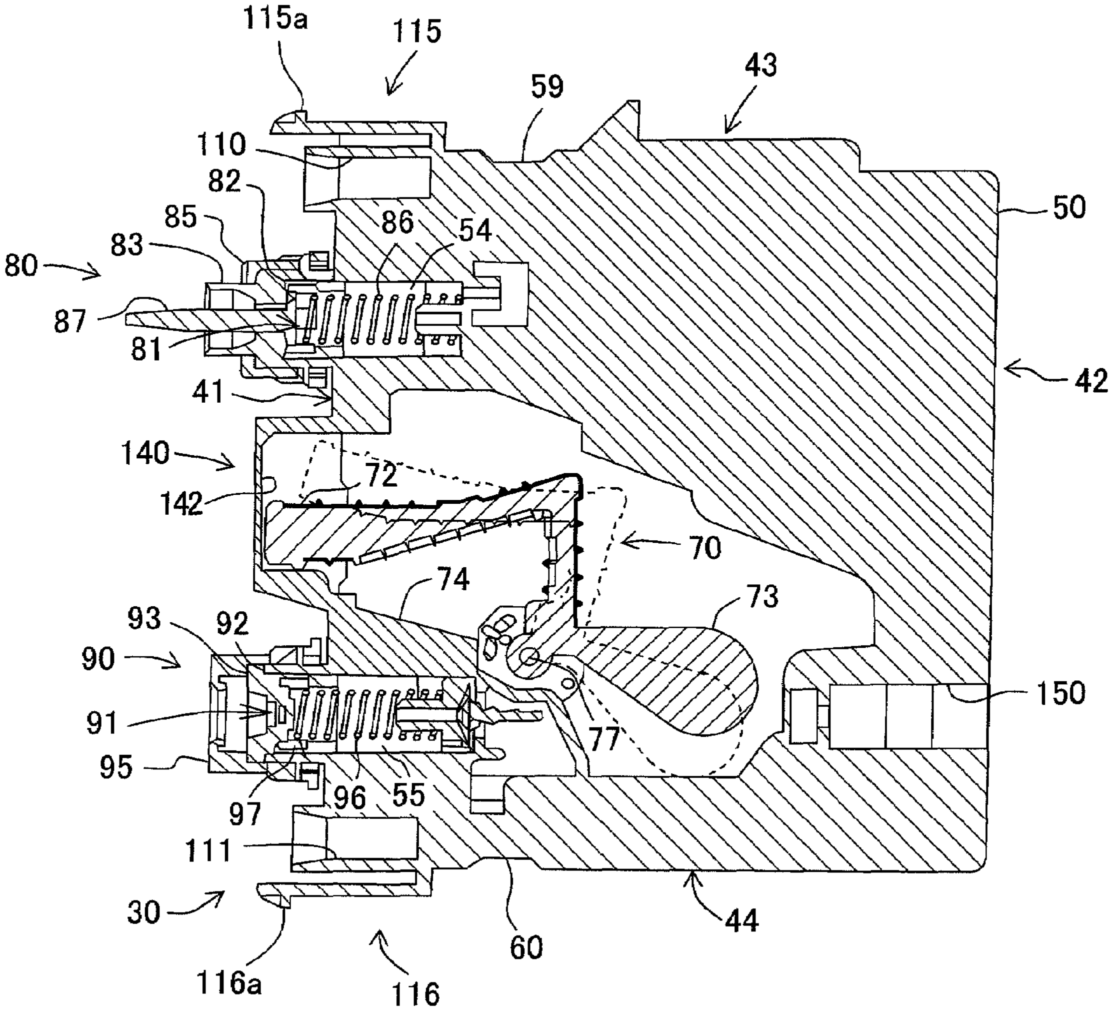
FIG. 7 is a cross sectional view of the cartridge body, taken along a line VII-VII in FIG. 5A.
Figure 8:
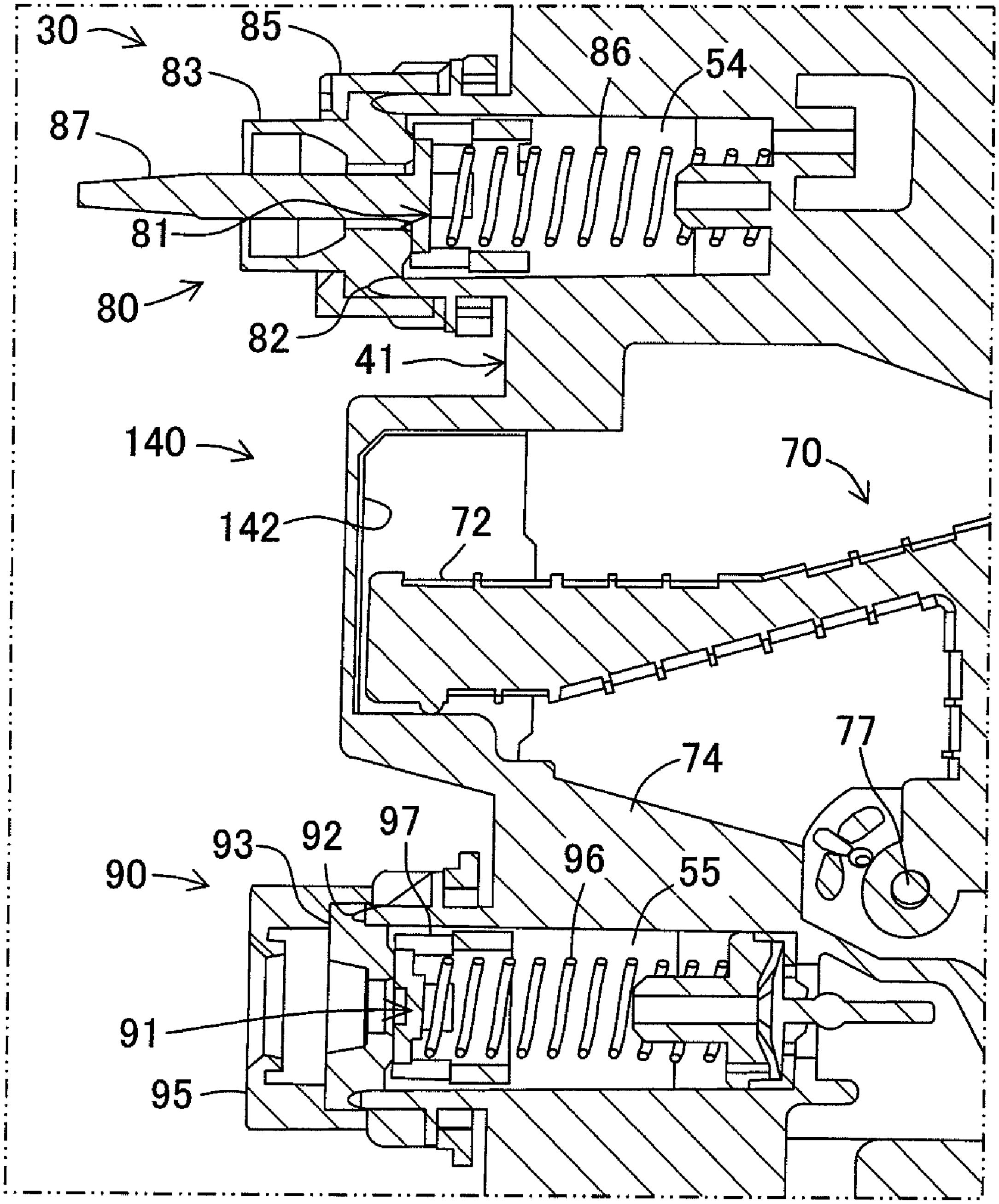
FIG. 8 is an enlarged cross sectional view showing the construction of a front portion of the cartridge body.

FIG. 5 (FIGS. 5A and 5B) is a perspective view showing the external shape of the cartridge body 30, wherein FIG. 5A shows the construction of the cartridge body 30 obliquely from the front, and FIG. 5B shows the construction of the cartridge body 30 obliquely from the rear. FIG. 6 is a side view of the cartridge body 30 shown in FIG. 5. FIG. 7 is a cross sectional view of the cartridge body 30 taken along a line VII-VII in FIG. 5A. FIG. 8 is an enlarged cross sectional view showing the construction of the front portion 30a of the cartridge body 30.

As shown in FIGS. 5 and 6, the cartridge body 30 has a substantially flat hexahedron same as the cartridge 10a, and has a front surface 41, a rear surface 42, an upper surface 43, a lower surface 44, a left surface 45 and a right surface 46. Each of the front surface 41 and the rear surface 42 has a shape which is long in the vertical direction. The front surface 41 and the rear surface 41 are located on the front side and the rear side, respectively, of the cartridge 10a in an insertion direction (X direction) in which the cartridge 10a is inserted. Each of the upper surface 43 and the lower surface 44 has a shape which is long in the insertion direction. The left surface 45 and the right surface 46 are respectively located on a left and a right side seen from the rear surface 42 in the insertion direction, each of the left and right surfaces 45, 46 having a square shape. The cartridge body 30 further includes a frame 50 which defines the chassis or casing body of the cartridge body 30; an arm 70 for detecting a remaining amount of the ink (ink remaining amount); an air communication valve 80, an ink supply valve 90 and a transparent film (not shown) which forms the ink chamber 100 together with the frame 50.

Among the above-described parts or components, the frame 50 forms the casing body of the cartridge body 30 as described above, and defines the surfaces 41 to 46. Further, the frame 50 is formed of a transparent or translucent resin material which has translucency or through which a light is transmittable. For example, the frame 50 is formed by performing injection-molding of a resin material such as polyacetal, nylon, polyethylene, or polypropylene.

As shown in FIGS. 5 and 6, the frame 50 includes an outer wall 51 and an inner wall 52. The outer wall 51 is formed to have an annular shape in a side view along the front surface 41, the upper surface 43, the rear surface 42 and the lower surface 44 of the cartridge body 30. The inner wall 52 is arranged to be inside the outer wall 51. The outer wall 51 and the inner wall 52 are formed integrally with each other. A recessed portion 59 which is recessed downward is formed on the upper surface 43 of the outer wall 51. A recessed portion 60 which is recessed upward is formed on the lower surface 44 of the outer wall 51. Thin films formed of transparent resin are adhered or welded to the left and right peripheral portions, of the outer wall 51, respectively, the left and right peripheral portion being located on the side of the left surface 45 and on the right surface 46, respectively, thereby the transparent thin film closing left and right openings 57a, 57b. As a result, a space surrounded by the outer wall 51 and the films is defined (partitioned) as the ink chamber 100.

The inner wall 52 provided to be arranged inside the outer wall 51 has a width which is substantially same as that of the outer wall 51. The films are also adhered to the left and right end portions, respectively, of the inner wall 52, the left and right end portions being located on the side of the left surface 45 and on the side of the right surface 46, respectively. Thus, it is possible to prevent the films from warping or sagging. At the same time, even when any external forces are applied to the front cover 31 and the rear cover 32 toward the cartridge body 30, the inner wall 52 supports the front cover 31 and the rear cover 32 at the inside thereof, thereby restricting the deformation of the front cover 31 and the rear cover 32.

As shown in FIG. 5, an ink inlet portion 150 is integrally formed in the frame 50 at a lower rear portion of the frame 50. The ink inlet portion 150 defines a tubular portion having a hole penetrating through the rear surface 42 of the frame 50 toward the ink chamber 100 and functions as an inlet passage through which the ink is introduced to the ink chamber 100.

A detection window 140 is formed in a front portion of the frame 50, at an area which is substantially central in the vertical direction of the frame 50, so that the detection window 140 is formed integrally with the frame 50 and to project frontward from the front surface 41. The detection window 140 is provided for visually or optically detecting the remaining amount of the ink stored in the ink chamber 100 (ink remaining amount) and is formed of a transparent or translucent resin material having light-transmittancy or translucency in a similar manner with the frame 50. The detection window 140 is irradiated with a light or light beam emitted in the Z direction (in the side direction) from a first optical sensor 230 such as a photo interrupter which will be described later and which is attached to the cartridge attachment section 8. As shown in FIG. 5, the detection window 140 has a hollow box shape having left and right side surfaces 140a, 140a. An internal space 142 of the detection window 140 is communicated with the ink chamber 100.

Next, the arm 70 will be explained. As shown in FIG. 7, the arm 70 is arranged inside the frame 50 and includes an indicator portion 72 and a float portion 73. The indicator portion 72 extends in the frontward direction and the float portion 73 extends in the rearward direction. A supporting shaft 77, which is located in the arm 70 at an intermediate position between the indicator portion 72 and the float portion 73, is pivotably supported by a rib 74 which is provided on an inner surface of the outer wall 51 so as to project toward the inside of (the internal space defined inside) the outer wall 51. The indicator portion 72 or a portion of the indicator portion 72 enters into and retracts from (is located in and is away from) the detection window 140 by the pivotal (locking) movement of the arm 70. In a state that the indicator portion 72 is located in the inside of the detection window 140, the light irradiated toward the side surface of the detection window 140 from the outside thereof in the Z direction is shielded by the indicator portion 72 and thus is not allowed to pass through the detection window 140. On the other hand, in a state that the indicator portion 72 is located at the outside of (is away from) the detection window 140, the light emitted toward the side surface of the detection window 140 from the outside thereof in the Z direction is allowed to pass through the detection window 140. The float portion 73 is formed to be hollow, and thus functions as a buoyant member with respect to the ink stored in the ink chamber 100.

Since the arm 70 is constructed as described above, in a state that the ink chamber 100 is filled with the ink, the float portion 73 is positioned at a relatively higher position in the ink chamber 100, while the indicator portion 72 is positioned at a relatively lower position in the ink chamber 100 and thus is located on the inside of the internal space 142 defined by the detection window 140. When the ink (amount of the ink) is reduced from this state to an amount smaller or less than a predetermined amount, the float portion 73 starts to lower, thereby pivoting the arm 70 to move about the supporting shaft 77. Then, at least a portion of the indicator portion 72 rises in the detection window 140, and finally retracts from the detection window 140. In a state that the indicator portion 72 is located at the outside of the detection window 140, the light emitted toward the detection window 140 in the side direction (in the Z direction) is allowed to pass through the detection window 140. Thus, as will be described later on, the optical sensor detects whether or not the light is allowed to pass through the detection window 140, thereby making it possible to detect the remaining amount of the ink in the ink chamber 100.

Next, the air communication valve 80 will be explained. As shown in FIG. 7, the air communication valve 80 is arranged at a position over or above the detection window 140 and is accommodated in a first-valve accommodating chamber 54 formed in the frame 50 at an upper portion of the front surface 41 of the frame 50. As shown in FIG. 8 which is a partially enlarged view, the first-valve accommodating chamber 54 has an opening 82 which communicates with the ink chamber 100. The air communication valve 80 is fitted to the opening 82 to function as a valve mechanism for opening and closing the opening 82.

To explain more specifically, the air communication valve 80 is constructed of members such as a valve body 87, a spring 86, a sealing member 83, a cap 85, and the like. The valve body 87 has a rod shape and is provided such that a front end of the valve body 87 projects frontward from the opening 82. Each of the sealing member 83 and the cap 85 has a cylindrical shape. In a state that the cap 85 is fitted on the sealing member 83, the cap 85 is fitted to the opening 82 of the first-valve accommodating chamber 54. The valve body 87 is inserted through the sealing member 83 and is arranged slidably in a frontward and rearward direction (a direction indicated by "X"; X direction). Further, the spring 86 is arranged inside the first-valve accommodating chamber 54, and biases the valve body 87 from the rear to the frontward direction.

In a state shown in FIG. 8 that the valve body 87 is biased by the spring 86 frontwardly and is positioned at a frontward position, the air communication valve 80 closes the opening 82 of the first-valve accommodating chamber 54. On the other hand, in a state that the valve body 87 is positioned at a rearward position resisting against the biasing force of the spring 86, an air communication opening 81 is defined in a clearance between the opening 82 and the valve body 87, thereby opening (releasing) the ink chamber 100 to the atmosphere via the air communication opening 81.

Next, the ink supply valve 90 will be explained. As shown in FIG. 7, the ink supply valve 90 is located below the detection window 140 and is accommodated in a second-valve accommodating chamber 55 formed in the frame 50 at a lower portion of the front surface 41 of the frame 50. As shown in FIG. 8 which is a partially enlarged view, the second-valve accommodating chamber 55 has an opening 92 which communicates with the ink chamber 100. The ink supply valve 90 is fitted to the opening 92 to function as a valve mechanism for opening and closing the opening 92.

To explain more specifically, the ink supply valve 90 is constructed of members such as a valve body 97, a spring 96, a sealing member 93, a cap 95, and the like. The valve body 97 has a cylindrical shape of whose axis extends in the frontward and rearward direction, and is arranged in the opening 92 of the second-valve accommodating chamber 55. Each of the sealing member 93 and the cap 95 has a substantially cylindrical shape defining a through hole which extends in the frontward and rearward direction. In a state that the cap 95 is fitted on the sealing member 93, the cap 95 is fitted to the opening 92; and the valve body 97 is arranged in the opening 92 (namely, in the second-valve accommodating chamber 55) to be slidable in the frontward and rearward direction in the opening 92. Further, the spring 96 is arranged inside the second-valve accommodating chamber 55, and biases the valve body 97 from the rear to the frontward direction.

In a state shown in FIG. 8 that the valve body 97 is biased by the spring 96 frontwardly and positioned at a frontward position, the ink supply valve 90 closes the opening 92 of the second-valve accommodating chamber 55. On the other hand, the cartridge attachment section 8 includes an ink needle (not shown) which is provided at a position corresponding to a position of the ink supply valve 90 when the cartridge 10 is attached to or mounted on the cartridge attachment section 8. The ink needle presses and moves the valve body 97 rearward when the cartridge 10 is attached to the cartridge attachment section 8. When the valve body 97 pressed and moved by the ink needle is displaced to the rear position against the biasing force of the spring 96, an ink supply opening 91 is defined in a clearance between the opening 92 and the valve body 97. As a result, the ink chamber 100 communicates, via the ink supply opening 91, with the tube 22 connected to the cartridge attachment section 8, thereby allowing the ink in the ink chamber 100 to be supplied through the tube 22 to the sub-tank **15*b* (see FIG. 2**).

Note that as shown in FIG. 7, a first-spring accommodating chamber 110 is formed in the frame 50 at a position over or above the first-valve accommodating chamber 54, and a second-spring accommodating chamber 111 is formed in the frame 50 at a position below or under the second-valve accommodating chamber 55. Each of the first and second-spring accommodating chambers 110, 111 is a hole having a bottom and is formed on the front surface 41 of the frame 50 penetrating through the front surface 41 (namely, is open on the front surface 41) in the rearward direction (namely, toward the ink chamber 100). The spring accommodating chambers 110 and 111 accommodate coil springs 23 and 24, respectively (see FIG. 9). The coil springs 23 and 24 are provided to bias frontward the front cover 31 which is attached to a front portion of the cartridge body 30.

Further, a first-cover supporting member 115 is formed in the frame 50 at a front end portion of the upper surface 43; and a second-cover supporting member 116 is formed in the frame 50 on a front end portion of the lower surface 44. The first and second-cover supporting members 115 and 116 include rod portions each of which extends frontward, and include projections 115*a*, 116*a* each of which has a claw shape and is formed on the front end of the rod portion thereof. The cover supporting members 115 and 116 support the front cover 31 which will be explained next, such that the front cover 31 is slidable and that the front cover 31 is prevented from falling off or detaching from the cartridge body 30.

Figure 9:
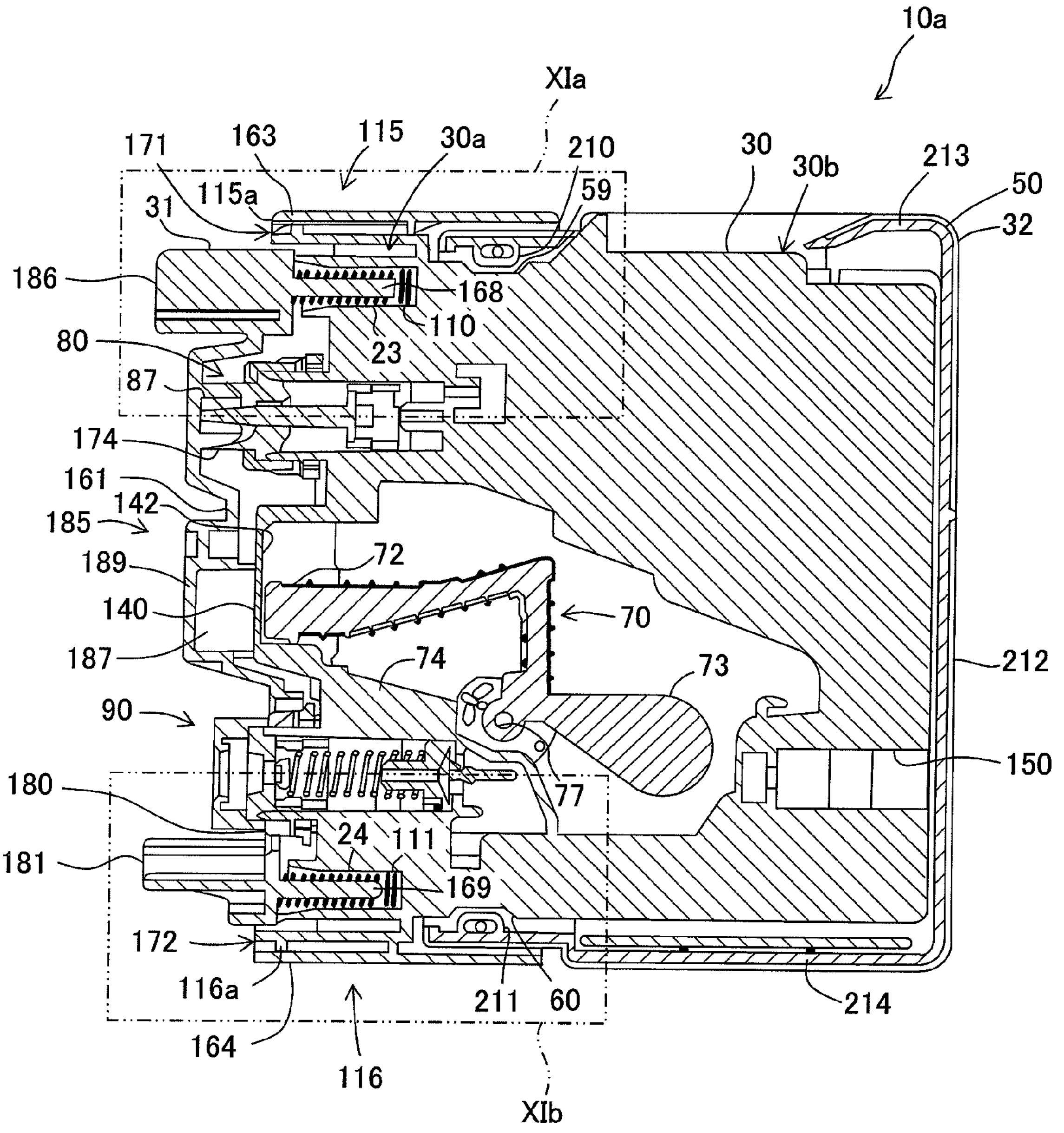
FIG. 9 is a cross sectional view showing the construction of the cartridge shown in FIG. 3A, taken along a line IX-IX in FIG. 3A.
Figure 10:
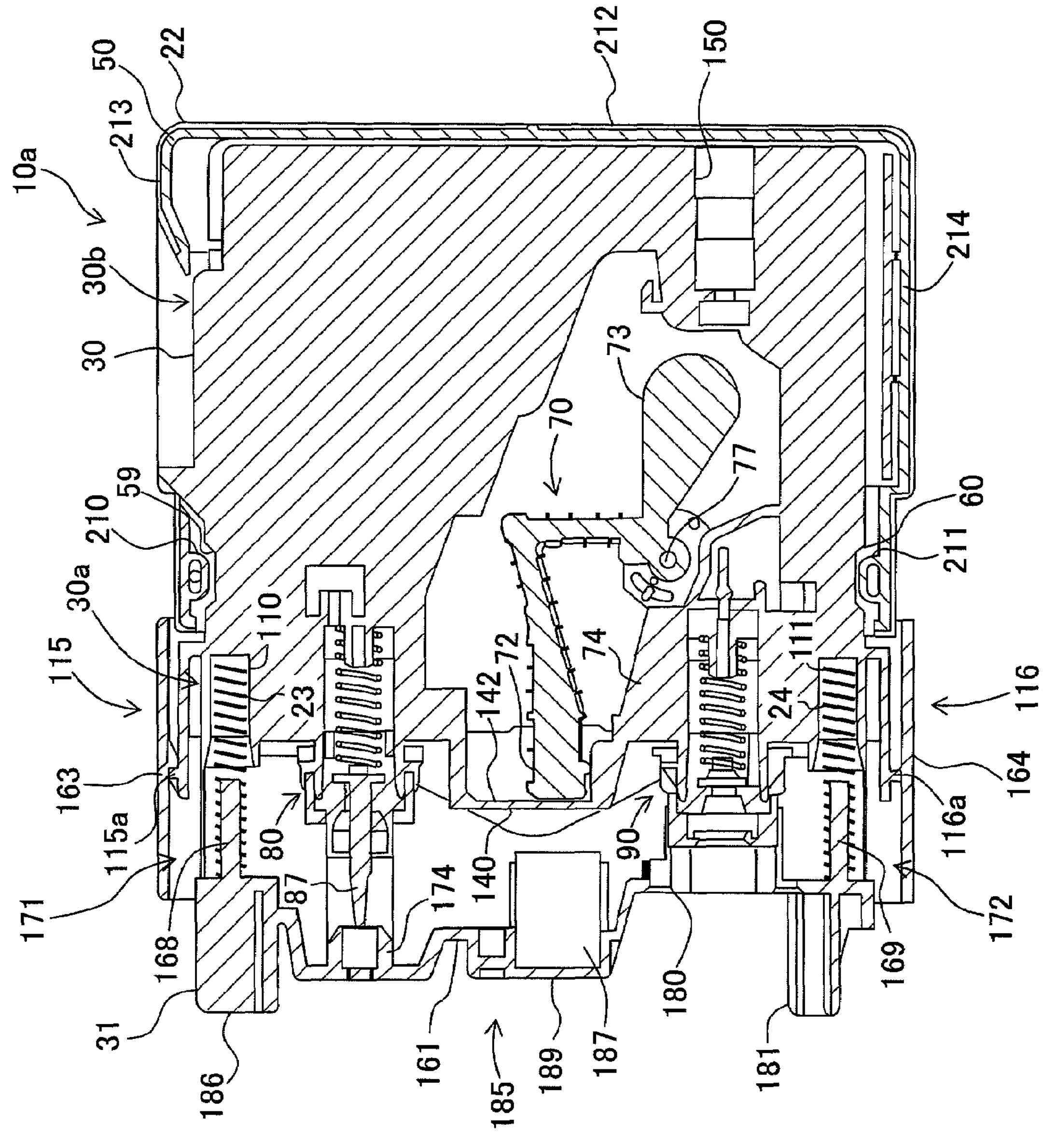
FIG. 10 is a cross sectional view showing the construction of the cartridge shown in FIG. 3B, taken along a line X-X in FIG. 3B.
Figure 11A:
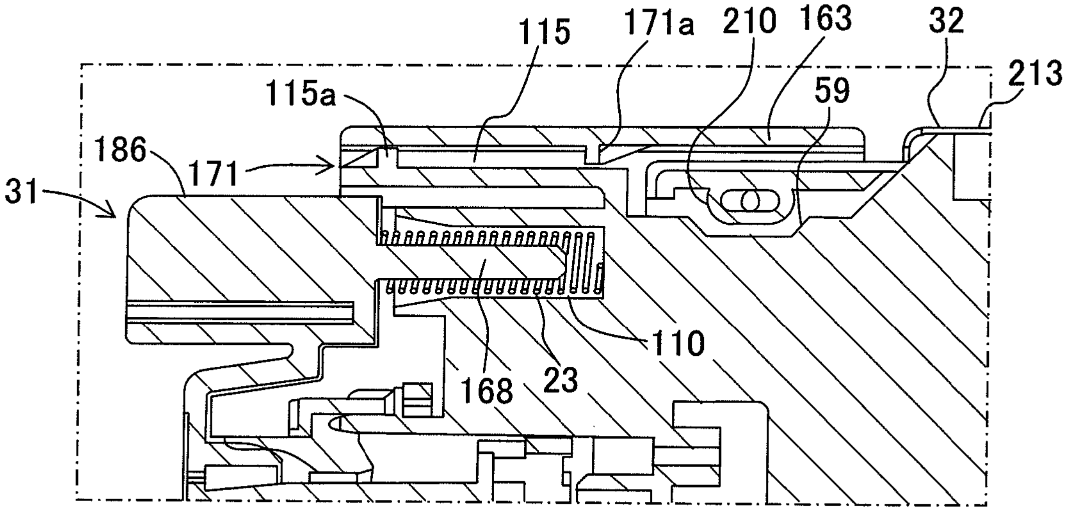
FIG. 11A is an enlarged view of an upper portion of the cartridge which is surrounded by a two-dot chain line XIa shown in FIG. 9.
Figure 11B:
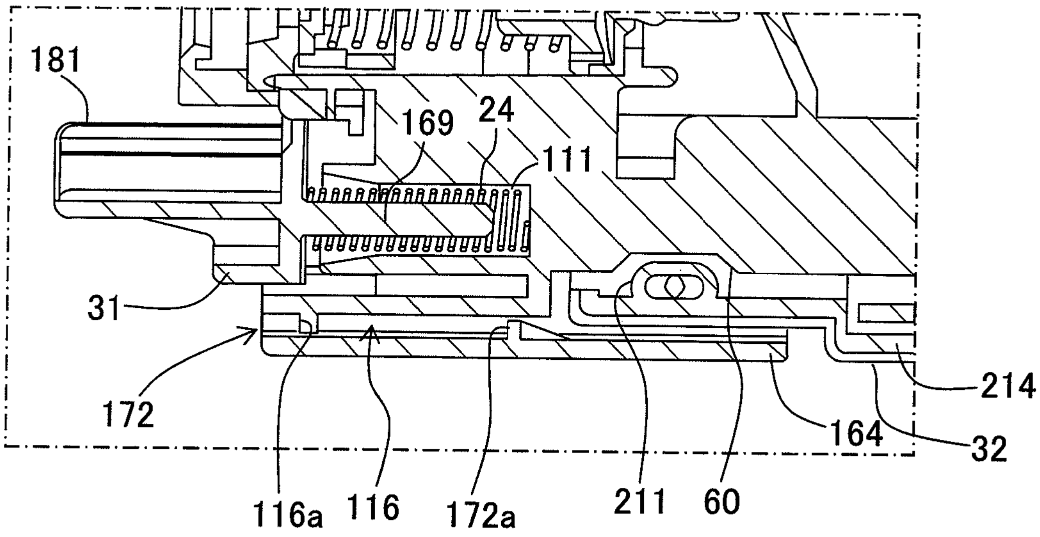
FIG. 11B is an enlarged view of a lower portion of the cartridge which is surrounded by a two-dot chain line XIb shown in FIG. 9.

FIG. 9 is a cross sectional view showing the construction of the cartridge 10*a* shown in FIG. 3A, taken along a line IX-IX in FIG. 3A. FIG. 10 is a cross sectional view showing the construction of the cartridge 10*a* shown in FIG. 3B, taken along a line X-X in FIG. 3B. FIG. 11A is a partial enlarged view showing the upper portion, of the cartridge 10*a*, which is surrounded by a two-dot chain line XIa shown in FIG. 9; and FIG. 11B is a partial enlarged view showing the lower portion, of the cartridge 10*a*, which is surrounded by a two-dot chain line XIb shown in FIG. 9.

As shown in FIG. 9, the front cover 31 is formed to have a casing shape or container shape which can accommodate the front portion 30*a* of the cartridge body 30, and is formed to be flat corresponding to the shape of the front portion 30*a* of the cartridge body 30. Further, the front cover 31 includes a front wall 161 corresponding to the front surface 41 of the cartridge body 30; an upper wall 163 corresponding to the upper surface 43 of the cartridge body 30; a lower wall 164 corresponding to the lower surface 44 of the cartridge body 30; a left wall 165 corresponding to the left surface 45 of the cartridge body 30; and a right wall 166 corresponding to the right surface 46 of the cartridge body 30. The front cover 31 defines a space surrounded with these walls which is open rearward and in which the front portion 30*a* of the cartridge body 30 can be accommodated. Further, the front cover 31 is provided with a first detection-objective portion 185 and a second detection-objective portion 186 which are detection objectives of a second optical sensor 235 and a first optical sensor 230, respectively, which will be described later. Furthermore, a cutout 187 is formed in the front cover 31.

As shown in FIGS. 3 and 4, the cutout 187 is formed on the front wall 161 of the front cover 31 at a substantially central portion in the vertical direction of the front wall 161 such that the front wall 161 is recessed rearward and that the left and right spaces of the front cover 31 are communicate with each other via the cutout 187. When the cartridge 10*a* is attached to or mounted on the cartridge attachment section 8 in a state that the front cover 31 is fitted on the cartridge body 30, the detection window 140 is exposed to the outside through the cutout 187.

The first detection-objective portion 185 is provided at a position in front of the cutout 187, and includes a bridge portion 189 projecting frontward from portions of the front wall 161, the portions being located on an upper and a lower side of the cutout 187, respectively. The bridge portion 189 is formed of a resin material through which the light cannot pass, and has a plate-like shape having a relatively small thickness in the frontward and rearward direction. A clearance 190 (see FIG. 3) is provided between the bridge portion 189 and the cutout 187 (namely, at a position in front of the cutout 187). Similarly to the cutout 187, this clearance 190 allows the left and right spaces of the front cover 31 to communicate with each other.

The second detection-objective portion 186 is provided so as to project frontward from an upper portion of the front wall 161. This second detection-objective portion 186 has a plate-like shape of which surfaces are oriented in the left and right direction (i.e., in the Z direction). Further, similarly to the first detection-objective portion 185, the second detection-objective portion 186 is formed of a resin material through which the light cannot pass.

The front cover 31 is provided with a projection 181 and guide rods 168, 169 (see FIG. 10). The projection 181 is a member, among the front cover 31, which is first brought into contact with the back (innermost) surface of the cartridge attachment section 8 in the attachment process in which the cartridge 10*a* is being attached to the cartridge attachment section 8. The guide rods 168, 169 guide the sliding movement of the front cover 31 relative to the cartridge body 30. The projection 181 is formed integrally with the front cover 31 so as to project frontward from a lower portion of the front wall 161 of the front cover 31.

The guide rods 168, 169 each have a rod shape and extend rearward from upper and lower portions, respectively, of the back surface of the front wall 161 (that is, a rear surface of the front wall 161 which is opposed to or faces the front surface 41 of the cartridge body 30). The guide rod 168 located in the upper portion is inserted, from the front, into an inner bore space defined by the coil spring 23 arranged in the first-spring accommodating chamber 110 of the cartridge body 30. The guide rod 169 located in the lower portion is inserted, from the front, into an inner bore space defined by the coil spring 24 arranged in the second-spring accommodating chamber 111 of the cartridge body 30.

Further, the front cover 31 is provided with slide grooves 171 and 172 which are formed in a front portion of the upper wall 163 and in a front portion of the lower wall 164 of the front cover 31, respectively. The slide grooves 171 and 172 guide, similarly to the guide rods 168 and 169, the front cover 31 in the sliding movement thereof relative to the cartridge body 30. Among the grooves 171 and 172, the upper slide groove 171 is constructed by forming (processing) the upper wall 163 of the front cover 31 so as to have a shape of a substantially inverted letter "U" as seen in the front view; and the lower slide groove 172 is constructed by forming the lower wall 164 of the front cover 31 so as to have a shape of letter "U" as seen in the front view. The slide grooves 171 and 172 are provided with projection pieces 171*a*, 172*a* (see FIGS. 11A, 11B), respectively, each of which is provided at a back (i.e., rear) portion thereof to project from a surface of the slide groove.

Further, as shown in FIGS. 9 and 10, a push portion (press portion) 174 is provided on the front cover 31 at a position between the first detection-objective portion 185 and the second detection-objective portion 186 located above the first detection-objective portion 185. Furthermore, an opening 180 is formed between the first detection-objective portion 185 and the projection 181. The push portion 174 is provided on the back surface of the front wall 161 of the front cover 31, at a position corresponding to the air communication valve 80 of the cartridge body 30. When the front cover 31 and the cartridge body 30 are moved closely to each other, the push portion 174 pushes and presses the front end of the valve body

87 of the air communication valve 80 in the rearward direction. The opening 180 is formed in the front wall 161 of the front cover 31 at a position corresponding to the ink supply valve 90.

Next, an explanation will be given about a case in which the front cover 31 is attached to (fitted on) the cartridge body 30. The front cover 31 is attached to the cartridge body 30 in a following manner, namely, by moving the front cover 31 and the cartridge body 30 closely to each other from a state that the cartridge body 30 is positioned behind the front cover 31. At first, the first-cover supporting member 115 is inserted into the upper slide groove 171 and at the same time the second-cover supporting member 116 is inserted into the lower slide groove 172. With this, the projection 115*a* provided on the front end of the first-cover supporting member 115 crosses over (advances over) the projection piece 171*a* and enters farther to the rear portion of the slide groove 171, and the projection 116*a* provided on the front end of the second-cover supporting member 116 advances over the projection piece 172*a* and enters farther to the rear portion of the slide groove 172. Thus, even when an attempt is made to pull out the front cover 31 from the cartridge body 30 in the frontward direction, the projections 115*a*, 116*a* and the projection pieces 171*a*, 172*a* are snagged on each other respectively, thereby inhibiting the front cover 31 from being pulled out (detached or separated) from the cartridge body 30.

When the front cover 31 is attached to the cartridge body 30 in such a manner, the two guide rods 168 and 169 provided on the front cover 31 are inserted into the inner bore space defined by the spring 23 in the first-spring accommodating chamber 110 of the cartridge body 30 and into the inner bore space defined by the spring 24 in the second-spring accommodating chamber 111 of the cartridge body 30, respectively. The direction of the sliding movement of the front cover 31 relative to the cartridge body 30 is restricted to the frontward and rearward direction by the guide rods 168, 169, while the front cover 31 is biased frontward by the springs 23, 24. Thus, when any external force is not applied, the front cover 31 is maintained in a state that the front cover 31 is separated from the cartridge body 30 in the frontward direction (the state shown in FIG. 10; hereinafter referred to as being at a “first position”). On the other hand, when the external force is applied such that the front cover 31 is moved closely to the cartridge body 30, the front cover 31 is maintained in a state that the front cover 31 is moved closely to and in contact with the cartridge body 30 (the state shown in FIG. 9; hereinafter referred to as being at a “second position”).

When the front cover 31 is moved slidably from the first position to the second position, the push portion 174 of the front cover 31 pushes and presses the valve body 87 of the air communication valve 80 in the rearward direction. As a result, the valve body 87 is pressed into the first-valve accommodating chamber 54 resisting against the biasing force of the spring 86, thereby opening (releasing) the inside of the ink chamber 100 to the atmosphere. On the other hand, at this time, the ink supply valve 90 of the cartridge body 30 projects frontward through the opening 180 of the front cover 31. As a result, the valve body 97 of the ink supply valve 90 is pressed and moved rearward by the ink needle (not shown) provided on the cartridge attachment section 8, resisting against the biasing force of the spring 96, thereby allowing the ink in the ink chamber 100 to be supplied, through the ink supply opening 91 and the tube 22, to the sub-tank 15*b* (see FIG. 2).

As shown in FIG. 9, the rear cover 32 is formed to have a casing-like shape (container-like shape) which can accommodate the rear portion 30*b* of the cartridge body 30, and is formed to be flat corresponding to the shape of the rear portion 30*b* of the cartridge body 30. Further, the rear cover 32 includes a rear wall 212 corresponding to the rear surface 42 of the cartridge body 30; an upper wall 213 corresponding to the upper surface 43 of the cartridge body 30; a lower wall 214 corresponding to the lower surface 44 of the cartridge body 30; a left wall 215 corresponding to the left surface 45 of the cartridge body 30; and a right wall 216 corresponding to the right surface 46 of the cartridge body 30. The rear cover 32 can accommodate the rear portion 30*b* of the cartridge body 30 in a space which is defined and surrounded by these walls and which is open to the front.

Projection pieces 210, 211 are provided on the inner surface of the upper wall 213 and the inner surface of the lower wall 214, respectively, of the rear cover 32. These projection pieces 210, 211 are provided corresponding to the recessed portion 59 formed in the upper surface 43 and the recessed portion 60 formed in the lower surface 44 of the frame 50, respectively. When the rear cover 32 is attached to the rear portion 30*b* of the cartridge body 30, the projection pieces 210 and 211 are fitted in the recessed portions 59 and 60, respectively, thereby reliably engaging the cartridge body 30 and the rear cover 32 with each other.

Next, an explanation will be given about the construction of the cartridge 10*b*, as the other type of the cartridges, which is attached, similar to the cartridge 10*a*, to the cartridge attachment section 8. FIG. 12 (12A and 12B) are views each showing the construction of the cartridge 10*b*, as the other type of the cartridges; wherein FIG. 12A shows a perspective view of the cartridge 10*b* with the front cover 31 being illustrated in solid lines and the remaining other portion of the cartridge 10*b* being illustrated in broken lines, and FIG. 12B is a side view of the front cover 31. Note that the cartridge 10*b* is different from the cartridge 10*a* in that the front cover 31 of the cartridge 10*b* includes a first detection-objective portion 195 which has a shape different from that of the above-described first detection-objective portion 185 of the cartridge 10*a*. Thus, in the following description, only the construction of the first detection-objective portion 195 will be explained, and the remaining portions of the cartridge 10*b* of which constructions are common to those of the portions of the cartridge 10*a* corresponding thereto are omitted. Further, regarding the front cover 31 of the cartridge 10*b*, portions of the front cover 31 of which constructions are similar to those of the corresponding portions of the front cover 31 of the cartridge 10*a*, the reference numerals as used to identify the corresponding portions of the cartridge 10*a* are used, and the explanation therefor will be partly omitted.

As shown in FIG. 12, the first detection-objective portion 195 of the cartridge 10*b* is formed, similar to the above-described first detection-objective portion 185, of a resin material through which the light cannot pass; and the first detection-objective portion 195 is provided on the front wall 161 of the front cover 31, at a substantially central portion, in the vertical direction, of the front wall 161 of the front cover 31. The first detection-objective portion 195 includes a bridge portion 199 projecting frontward from portions of the front wall 161, the portions being located on an upper and a lower side of the cutout 187, respectively. Unlike the bridge portion 189 of the cartridge 10*a*, this bridge portion 199 is provided with side walls 198 at the left and right ends of the bridge portion 199, respectively. Thus, unlike the first detection-objective portion 185 of the cartridge 10*a*, any clearance 190 through which the light passes between the bridge portion 189 and the cutout 187 is not formed in the first detection-objective portion 195. Instead of the clearance 190, the bridge portion 199 is provided with the side walls 198 for preventing the light from passing through the first detection-objective portion 195 of the cartridge 10*b*.

Figure 13:
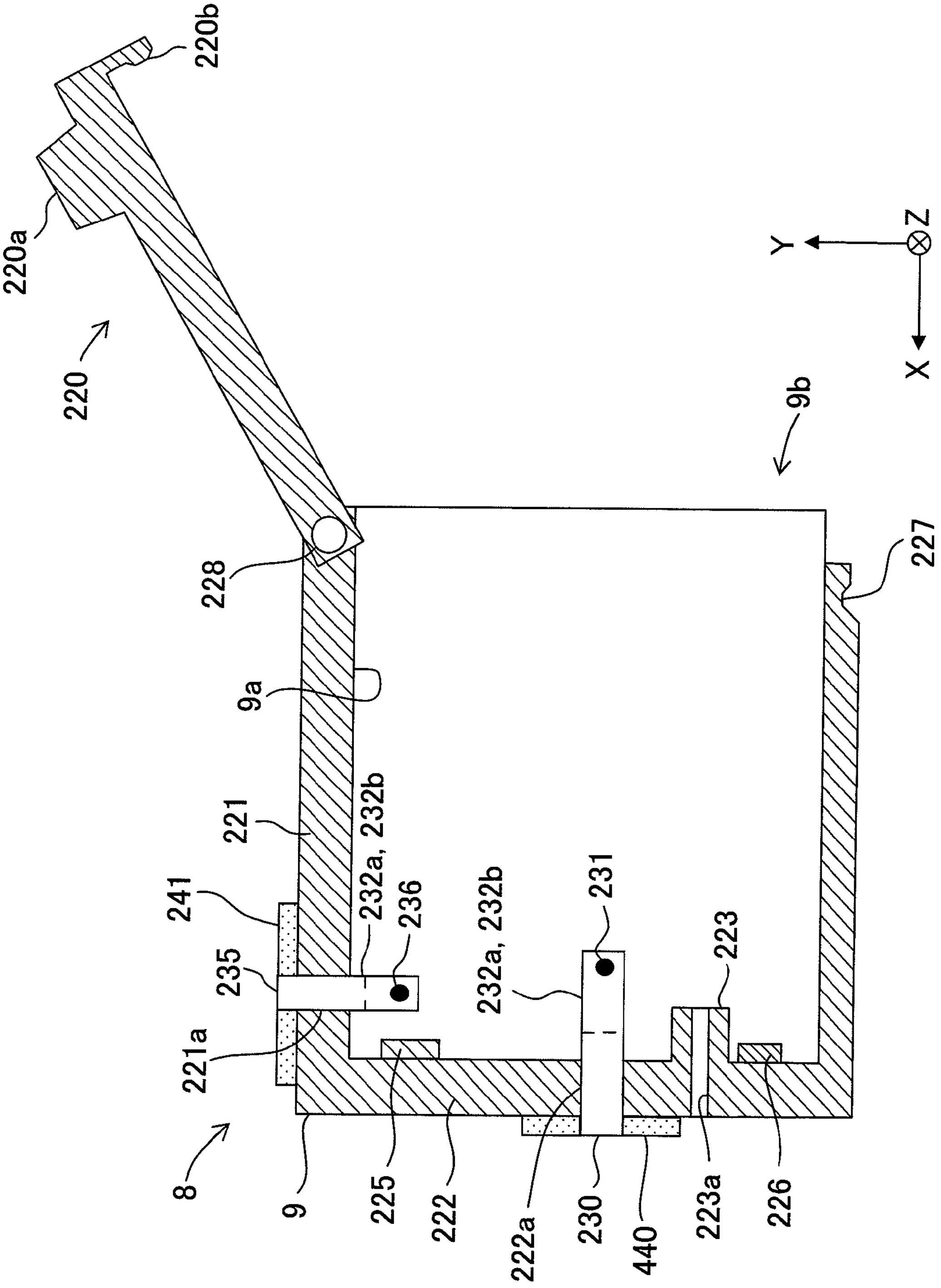
FIG. 13 is a cross sectional view schematically showing the construction of a cartridge attachment section.

FIG. 13 is a schematic cross sectional view showing the construction of the cartridge attachment section 8. In this embodiment, as shown in FIG. 13, the cartridge attachment section 8 includes an accommodating casing 9 which is partitioned into five accommodating chambers 9*a* so that the above-described cartridges 10 (cartridges 10*a*, 10*b*) for storing five color inks are to be attached to the accommodating chambers 9*a*, respectively; and a lock lever 220 which opens and closes an opening 9*b* of the accommodating casing 9. The accommodating casing 9 has a substantially rectangular parallelepiped shape having the opening 9*b* in the rear portion (right portion in FIG. 13) of the accommodating casing 9. A basal end portion of the lock lever 220 is pivotably supported by the rear end portion of an upper wall 221 of the accommodating casing 9. Thus, the lock lever 220 functions as a rectangular lid member (covering member) which covers the opening 9*b* of the accommodating casing 9. Accordingly, by pivoting the lock lever 220 upwardly about the basal end portion thereof such that the opening 9*b* is opened, it is possible to attach, through the opening 9*b*, the cartridges 10 to the accommodating chambers 9*a* respectively. A first optical sensor 230 and a second optical sensor 235 are provided on each of the accommodating chambers 9*a* on the back portion (left portion in FIG. 13) of each of the accommodating chambers 9*a* in order to detect information about one of the cartridges 10 which is attached to each of the accommodating chambers 9*a*.

Figure 14A:
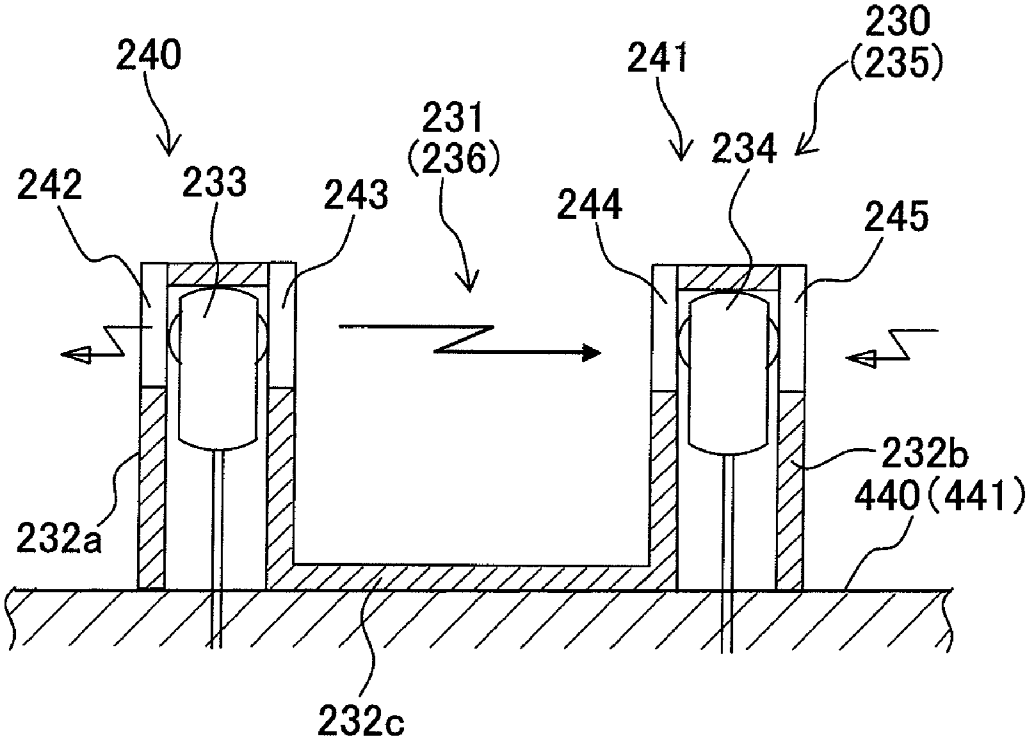
FIG. 14A is a cross sectional view schematically showing the construction of a first optical sensor.
Figure 14B:
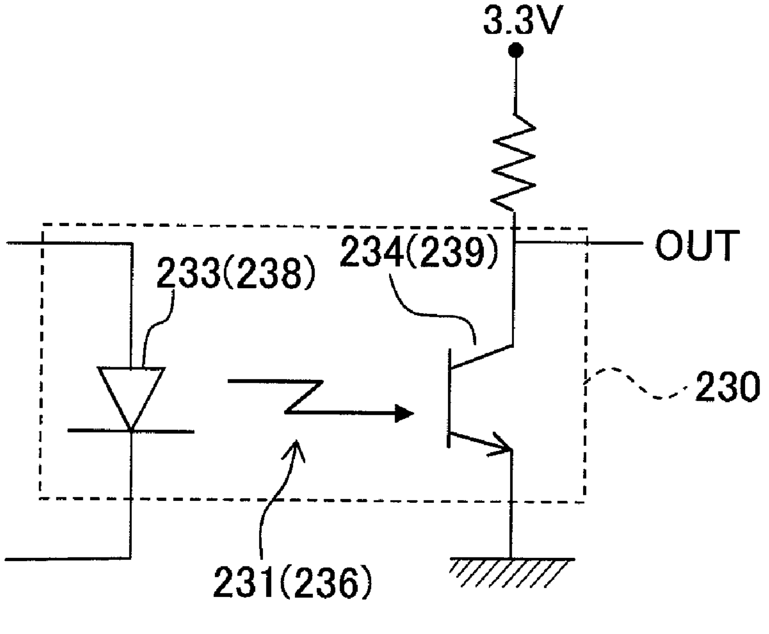
FIG. 14B is a schematic circuit diagram of the first optical sensor.

FIG. 14 (FIGS. 14A and 14B) shows the construction of the first optical sensor 230, wherein FIG. 14A is a cross sectional view schematically showing the construction of the first optical sensor 230, and FIG. 14B is a schematic circuit diagram of the first optical sensor 230. Note that the following explanation is given for one piece of the first optical sensors 230. As shown in FIG. 14A, in this embodiment, a photo interrupter that is a light-transmission type optical sensor is employed as the first optical sensor 230, and the first optical sensor 230 includes a case for light-emitting element (light emitting element-case) 232*a* and a case for light-receiving element (light receiving element-case) 232*b* each of which is formed with a resin and to have a shape of hollow arm, and which pair with each other and extend parallel to each other. A base portion of the light emitting element-case 232*a* and a base portion of the light receiving element-case 232*b* are connected to each other by a resin member 232*c* which is formed of a resin material similar to the cases 232*a* and 232*b*. The first optical sensor 230 as a whole is formed to have an external shape which is a substantially U-shaped.

A light-emitting element 233 which is constructed of a light-emitting diode (see FIG. 14B) is arranged inside an end portion of the light emitting element-case 232*a*, and a light-emitting portion 240 is constructed of the light emitting element-case 232*a* and the light-emitting element 233. On the other hand, a light-receiving element 234 which is constructed of a photo diode (see FIG. 14B) is arranged inside an end portion of the light receiving element-case 232*b*, and a light-receiving portion 241 is constructed of the light receiving element-case 232*b* and the light-receiving element 234. The light-receiving portion 241 and the light-emitting portion 240 pair with each other (which construct a pair of light-emitting and receiving portions).

The light emitting element-case 232*a* and the light receiving element-case 232*b*, which pair with each other (which constructs a pair of cases), are arranged at a predetermined spacing distance from each other. Two slits 242, 243 (second light-emission hole, first light-emission hole) are formed in the end portion of the light emitting element-case 232*a*, each of the slits 242, 243 penetrating through the end portion. Similarly, two slits 244, 245 (first light-reception hole, second light-reception hole) are formed at the end portion of the light receiving element-case 232*b*, each of the slits 244, 245 penetrating through the end portion. Among these slits 242 to 245, the slit 242, as one of the slits formed in the light emitting element-case 232*a*, is formed to be open in a direction not facing (not opposed to) the light receiving element-case 232*b* with which the light emitting element-case 232*a* constructs the pair of cases; the slit 243, as the other of the slits formed in the light emitting element-case 232*a*, is formed to be open toward (facing or opposed to) the light receiving element-case 232*b* with which the light emitting element-case 232*a* constructs the pair of cases. Further, the slit 244, as one of the slits formed in the light receiving element-case 232*b*, is formed to be open toward (facing or opposed to) the light emitting element-case 232*a* with which the light receiving element-case 232*b* constructs the pair of cases; the slit 245, as the other of the slits formed in the light receiving element-case 232*b*, is formed to be open in a direction not facing (not opposed to) the light emitting element-case 232*a* with which the light receiving element-case 232*b* constructs the pair of cases. Thus, when the light-emitting element 233 is driven to emit light (light beam), the light is emitted via or through the slits 242 and 243. The light-receiving element 234 is capable of receiving light (incident light) via or coming from the two slits 244 and 245. Further, the light emitted from the light-emitting element 233 via the slit 243 is received by the light-receiving element 234 via the slit 244 of the light-receiving element 234 which pairs with (construct a pair with) the light-emitting element 233.

Further, regarding FIG. 14B showing the detection circuit diagram, in a state that the light does not enter into (any light does not come into) the photo diode constructing the light-receiving element 234, the photo diode is in an "OFF" state and the first optical sensor 230 outputs a signal of a relatively "HIGH" level. On the other hand, in a state that the light enters into (light comes into) the photo diode, the photo diode is in an "ON" state and the first optical sensor 230 outputs a signal of a relatively "LOW" level.

As shown in FIG. 13, the first optical sensor 230 as described above is provided on and attached to a back wall 222 of the accommodating casing 9, at a substantially central position of the back wall 222 in the up and down (vertical) direction, in a state that the light emitting element-case 232*a* and the light receiving element-case 232*b* extend from the back wall 222 toward the opening 9*b* (namely, extend in the rearward or backward direction) and such that the light-emitting element 233 and the light-receiving element 234 are arranged in the left and right (in the Z direction in FIG. 13). Further, in a space between the light-emitting element 233 and the light-receiving element 234 (namely, between the light emitting element-case 232*a* and the light receiving element-case 232*b*), an area 231 is defined. When the light-emitting element 233 is driven to emit the light, the area 231 becomes an optical path for the light emitted from the light-emitting element 233 and travelling toward the light-receiving element 234 which pairs with the light-emitting element 233. Further, the first optical sensor 230 as described above is fixed to a sensor substrate 440 when the light-emitting element 233 and the light-receiving element 234 are soldered to the sensor substrate 440 at the resin member 232*c* (see FIG. 4) located at the base portion of each of the light-emitting element 233 and the light-receiving element 234. Thus, the first optical sensor 230 is electrically connected to the side of the body of the recording apparatus 1 via the sensor substrate 440. The sensor substrate 440 is formed to have a substantially rectangular shape that is long in one direction. Five pieces of the first optical sensor 230, which correspond to the ink cartridges, respectively, are arranged in a row in the Z direction that is the longitudinal direction of the sensor substrate 440. Openings 222*a* are formed to penetrate through the outer surface of the back wall 222 toward the opening 9*a* (namely, penetrate in the rearward direction) at positions corresponding to arrangement positions of the five first optical sensors 230, respectively. The cases 232*a*, 232*b* of each of the first optical sensors 230 are arranged in a state that the cases 232*a*, 232*b* extend toward the opening 9*a* through one of the openings 222*a* formed in the back wall 222.

Figure 15:
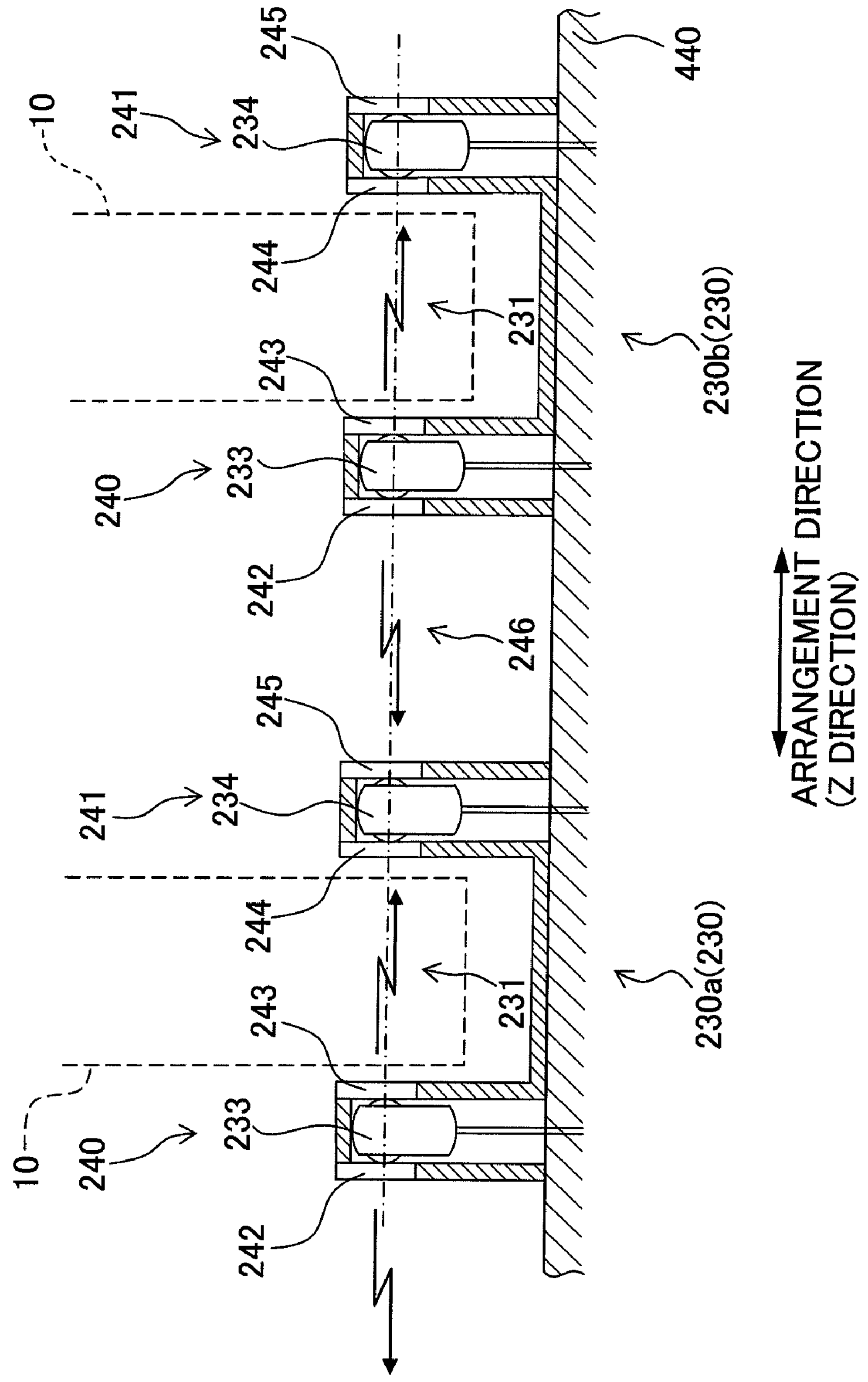
FIG. 15 is a cross sectional view schematically showing two first optical sensors, among a plurality of pieces of the first optical sensor provided on the cartridge attachment section, the two first optical sensors being adjacent to each other.

FIG. 15 is a sectional view schematically showing two adjacent first optical sensors 230 (230*a*, 230*b*) among the first optical sensors 230 arranged in the cartridge attachment section 8. As shown in FIG. 15, the two first optical sensors 230*a*, 230*b* adjacent to each other are arranged such that the light-emitting portion 240 and the light-receiving portion 241, which pair with each other in each of the two adjacent sensors 230*a* and 230*b*, are arranged to form a row in the Z direction and such that the light-emitting portions 240 and the light-receiving portions 241 of the two adjacent sensors 230*a* and 230*b* are alternately arranged in the Z direction. Namely, the light-emitting element 233 and the light-receiving element 234 included in each of the two adjacent first optical sensors 230*a*, 230*b* are arranged to be on a same axis in the Z direction (see dashed-dotted line in FIG. 15) and such that the light-receiving element 234 of the first optical sensor 230*a* is adjacent to the light-receiving element 233 of the first optical sensor 230*b*.

According to the construction as described above, the light-receiving element 234, which is included in the light-receiving portion 241 of the first optical sensor 230*a*, is capable of receiving the light from the light-emitting element 233 included in the light-emitting portion 240 which pairs with the light-receiving portion 241, via the slit 243 of the light-receiving portion 241 and the slit 244 of the light-emitting portion 240; and is capable of receiving the light from the light-emitting element 233 which is included in another light-emitting portion 240 of the first optical sensor 230*b* which is adjacent to the first optical sensor 230*a* and which pairs with another light-receiving portion 241, via the slit 245 of the light-receiving portion 241 and the slit 242 of the another light-emitting portion 240. Further, an area between the light-emitting portion 240 of the first optical sensor 230*b* and the light-receiving portion 241 of the first optical sensor 230*a* defines an area 246 which is an optical path (light path) for the light emitted from the light-emitting element 233 of the first optical sensor 230*b* toward the light-receiving element 234 of the first optical sensor 230*a*. The area 246 is a space in which any intervening object, which shields (blocks) the light passing through the area 246 or which lowers the brightness (illuminance) of the light passing through the area 246, does not exist.

Here, the term “intervening object” means, upon judging or determining the illuminance of the light emitted from the light-emitting element 233 based on the received light by the light-receiving element 234 via the slit 245, an object which shields the light emitted from the light-emitting element 233 and received by the light-receiving element 234 via the slit 245 or lowers the illuminance of the light to an extent that the judgment is hard to made; and the term “intervening object” is a concept which does not encompass, for example, air, transparent glass, etc.

Note that although only the two first optical sensors 230*a*, 230*b* which are included in the five optical sensors 230 and which are adjacent to each other are explained above, any two arbitrary sensors 230, 230 which are among the five first optical sensors 230 and which are adjacent to each other are constructed in a same manner as for the first optical sensors 230*a* and 230*b* described above. Further, among the five first optical sensors 230, first optical sensors 230 which are located at ends in the aligned five first optical sensors 230 (namely, located at one end and the other end in the Z direction) may have a construction different from that shown in FIG. 15. More specifically, if the first optical sensor 230*a* shown in FIG. 15 were assumed to be located in one end in the Z direction, then there would be no light-receiving portion 241 which is adjacent to the light-emitting portion 240 of the first optical sensor 230*a* and which constructs another pair with (which pairs with) another light-emitting portion 240 of another first optical sensor 230. Therefore, there is no need to provide any slit 242 in the light emitting element-case 232*a* for the light-emitting portion 240 of such a first optical element 230*a* located in the one end in the Z direction; and thus the first optical element 230*a* located in the one end may have a construction without the slit 242. On the other hand, if the first optical sensor 230*b* shown in FIG. 15 were assumed to be located in the other end in the Z direction, then there would be no light-emitting portion 240 which is adjacent to the light-receiving portion 241 of the first optical sensor 230*b* and which pairs with another light-receiving portion 241 of still another first optical sensor 230. Therefore, there is no need to provide any slit 245 in the light receiving element-case 232*b* for the light-receiving portion 241 of such a first optical element 230*b* located in the other end in the Z direction; and thus the first optical element 230*b* located in the other end may have a construction without the slit 245.

The second optical sensors 235 have a construction same as that of the first optical sensors 230, and hence any detailed explanation for the construction of the second optical sensors 235 is omitted. Note that, however, as shown in FIG. 13, the second optical sensors 235 are provided on the upper wall 221 of the accommodating casing 9, at portions located on the rear side in the upper wall 221. Each of the second optical sensors 235 is attached in a state that the light emitting element-case 232*a* and the light receiving element-case 232*b* extend downward from the upper surface 221 and the light-emitting element 233 and the light-receiving element 234 are arranged in the left and right (in the Z direction in FIG. 13). Further, in a space between the light-emitting element 233 and the light-receiving element 234, an area 236 is defined (see also FIG. 14A). When the light-emitting element 233 is driven to emit the light, the area 236 becomes an optical path for the light emitted from the light-emitting element 233 and travelling toward the light-receiving element 234 which pairs with the light-emitting element 233. Further, similarly to the first optical sensors 230 as described above, five pieces of the second optical sensor 235 are provided on the sensor substrate 441 in a row in the Z direction (see FIG. 13), corresponding to the ink cartridges which are attached to the cartridge attachment section 8, respectively, the Z direction being the longitudinal direction of the sensor substrate 441; and the second optical sensors 235 are arranged via openings 221*a*, respectively, which are formed to penetrate through the upper wall 221 of the accommodating casing 9. Since the arrangement of the second optical sensors 235 is same as that of the first optical sensors 230 explained with reference to FIG. 15, any detailed explanation therefor is herein omitted.

Further, as will be explained in more detail below, when the cartridges 10 are attached to the cartridge attachment section 8, the first optical sensors 230 as described above function to detect the type of the cartridges 10 and to detect the remaining amount of the ink remained in the cartridges 10, respectively. On the other hand, in a process in which the cartridges 10 are attached to the cartridge attachment section 8, the second optical sensors 235 as described above function to detect whether or not the cartridges 10 are being attached, respectively.

A connecting portion 223, which is connected to the ink supply opening 91 of each of the cartridges 10 is provided on a lower portion of the back wall 222 of the accommodating casing 9. The connecting portion 223 is formed to have a cylindrical shape, and to project from the back wall 222 toward the opening 9*b* (i.e., in rearward direction). The outside and the inside of the accommodating casing 9 communicate with each other via an inner hole 223*a* of the connecting portion 223. An end of the tube 22 is connected to the inner hole 223*a*, while the other end of the tube 22 is connected to the sub-tank 15*b* (see FIG. 2). Further, an ink needle (not shown) is provided inside the inner hole 223*a* of the connecting portion 223. When the cartridge 10 is attached, the ink needle presses and pushes the valve body 97 of the ink supply valve 90 of the cartridge 10. As a result, the ink supply opening 91 and the inner hole 223*a* of the connecting portion 223 communicate with each other, whereby the ink in the ink chamber 100 can be supplied to the sub-tank 15*b* through the tube 22.

Contacting portions 225, 226 are provided on the back wall 222 of the accommodating casing 9, at an upper portion and a lower portion, respectively, of the back wall 222. The contacting portion 225 on the upper side is provided corresponding to the second detection-objective portion 186 (see FIG. 10) provided on the upper portion of the cartridges 10. The contacting portion 225 receives the front end of the second detection-objective portion 186 in the attachment process in which the cartridge 10 is attached. The contacting portion 226 on the lower side is provided corresponding to the projection 181 (see FIG. 10) provided on the lower portion of the cartridge 10. The contacting portion 226 receives the front end of the projection 181 in the attachment process in which the cartridge 10 is attached.

The lock lever 220 pivotably supported on the accommodating casing 9 not only opens and closes the accommodating casing 9 as the lid member (covering member) for the opening 9*b* of the accommodating casing 9 as described above, but also assuredly attaches and fixes the cartridges 10 to the accommodating chamber 9*a*. To explain in more detail, the lock lever 220 is provided with, at a distal end portion thereof, a grip 220*a* projecting outward so as to be gripped by a user, and an engaging pawl 220*b* projecting inward so as to be engageable with the accommodating casing 9. On the other hand, an engaging groove 227, which is engageable with the engaging pawl 220*b*, is formed in the accommodating casing 9 at an end portion thereof located at a position below the opening 9*b*. When the user grips the grip 222 and moves the lock lever 220 pivotally to close the opining 9*b*, the engaging pawl 220*b* and the engaging groove 227 are engaged with each other, thereby assuredly closing the opening 9*b* of the accommodating casing 9 with the lock lever 220. Further, an opening/closing sensor 228 is provided on the lock lever 220 at a portion thereof at which the lock lever 220 is pivotably supported. With this opening/closing sensor 228, it is possible to detect whether the lock lever 220 is opened or closed.

Figure 16:
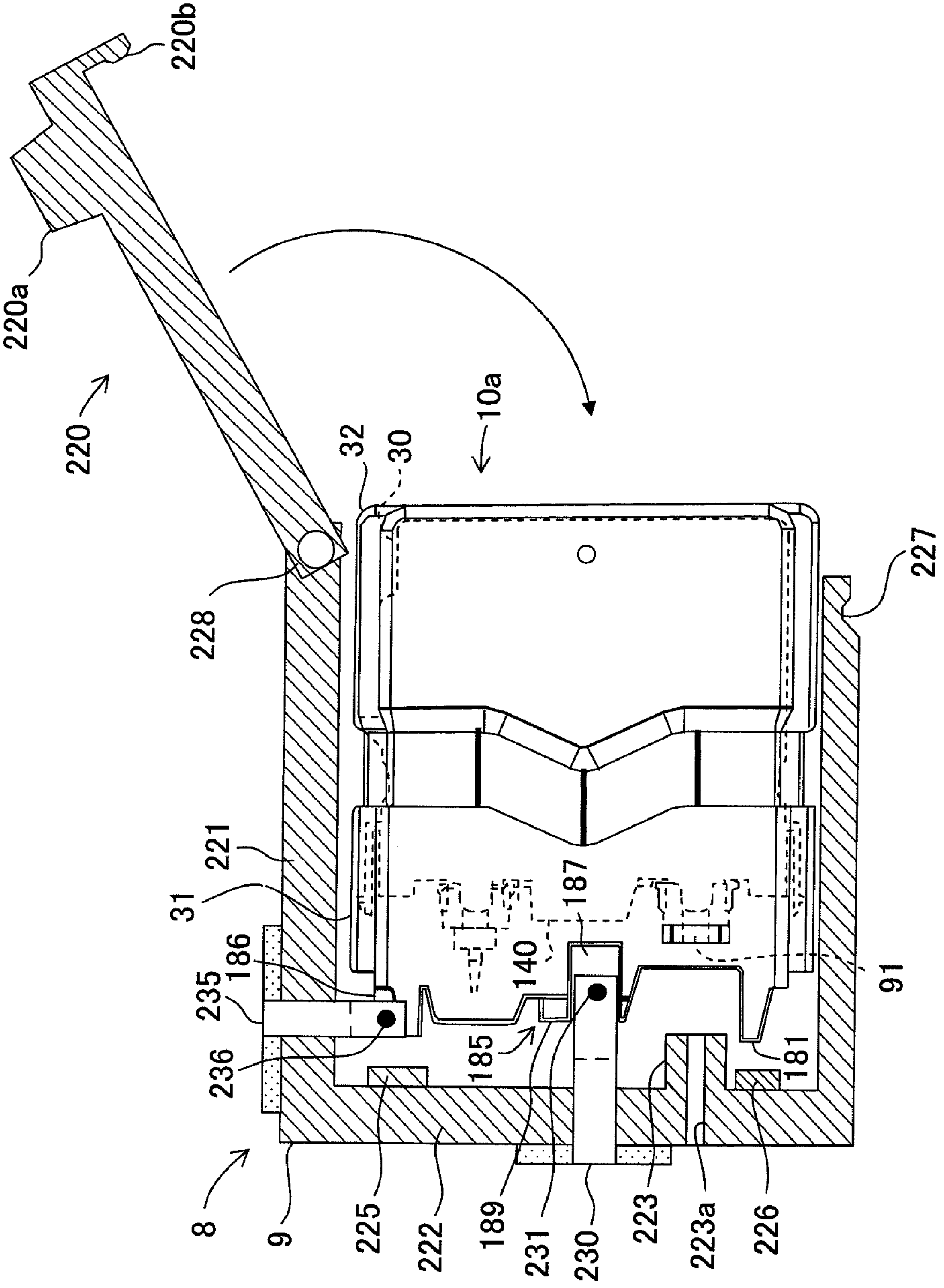
FIG. 16 is a cross sectional view schematically showing an attachment process (mounting process), in which the cartridge is being attached to (mounted on) the cartridge attachment section, with a second detection-objective portion detected by a second optical sensor.
Figure 17:
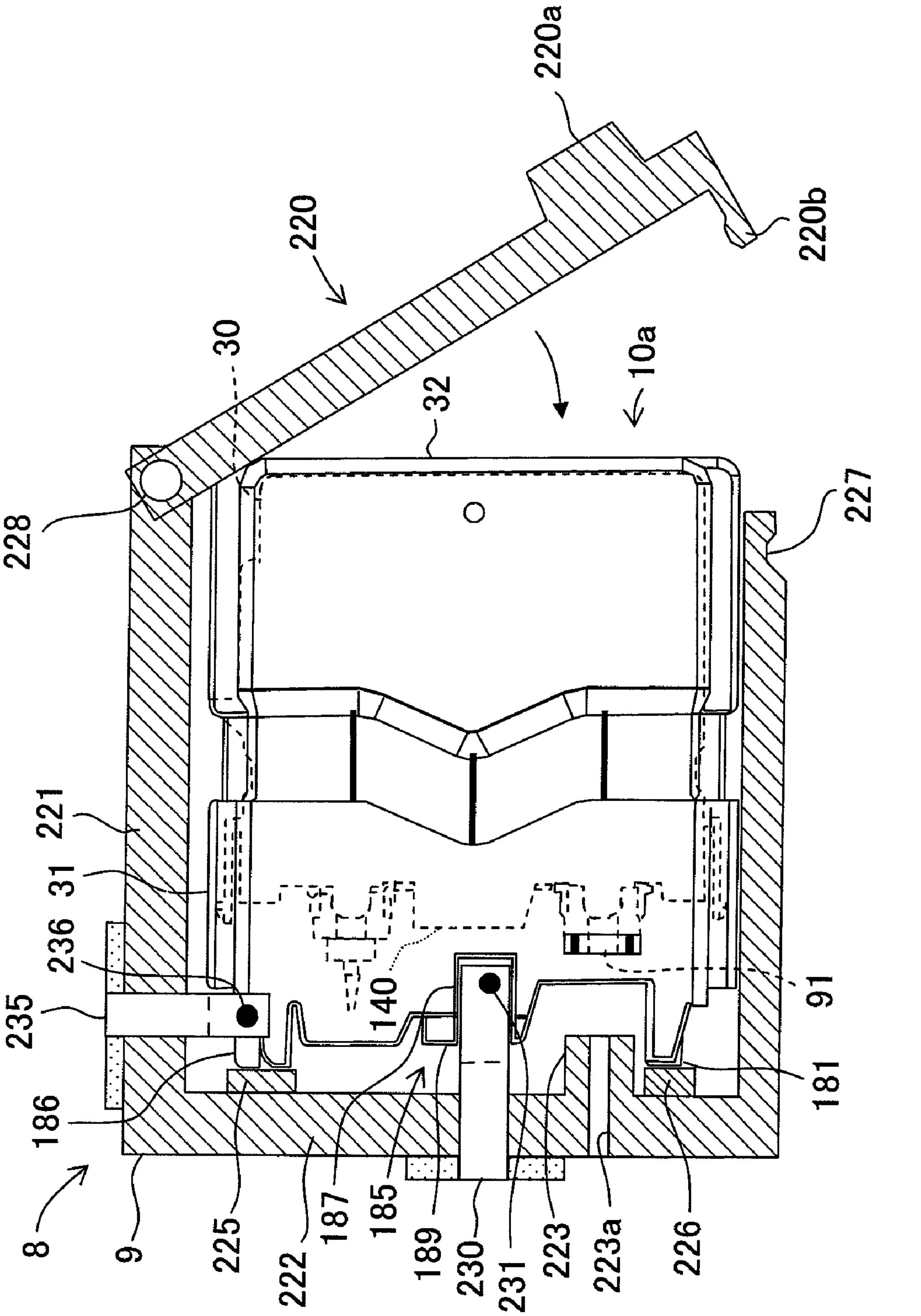
FIG. 17 is a cross sectional view schematically showing the attachment process in which the cartridge is being attached the cartridge attachment section, illustrating a state that a front end of the second detection-objective portion and a front end of a projection are brought into contact with a back wall of an accommodating casing.
Figure 18:
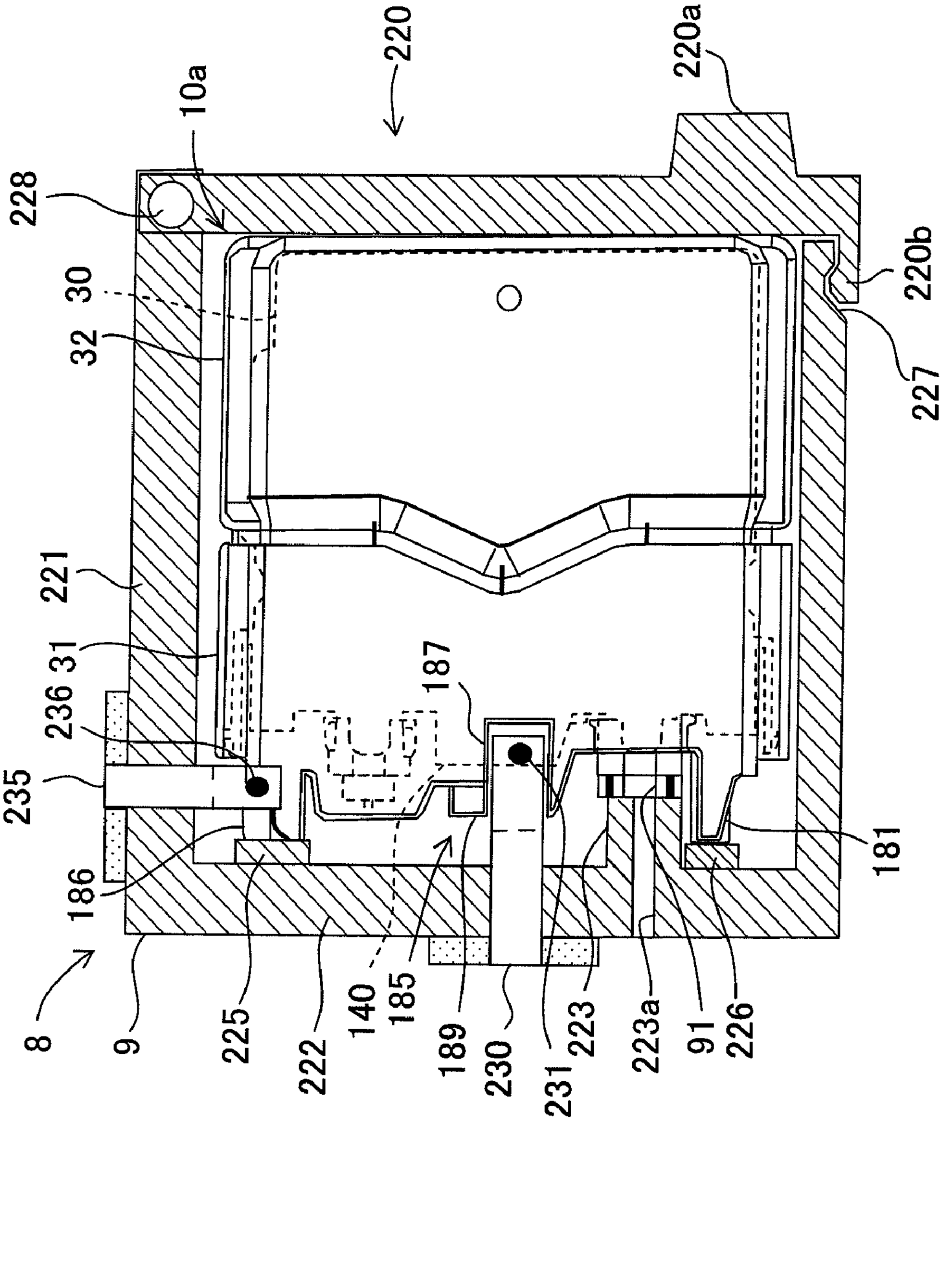

Next, an explanation will be given regarding an operation for attaching the cartridge 10 to the cartridge attachment section 8, with reference to FIGS. 16 to 18. Here, each of FIGS. 16 to 18 is a cross sectional view schematically showing the attachment process in which the cartridge 10*a* is being attached to the cartridge attachment section 8. FIG. 16 shows a state that the second detection-objective portion 186 is detected by the second optical sensor 235. FIG. 17 shows a state that the front end of the second detection-objective portion 186 and the front end of the projection 181 are brought into contact with the back wall 222 of the accommodating casing 9. FIG. 18 shows a state that the cartridge 10*a* is completely attached to the accommodating casing 9.

First, as shown in FIG. 16, when a substantial portion of the cartridge 10*a*, except for a rear end portion thereof, is inserted into the accommodating casing 9, then the bridge portion 189 of the first detection-objective portion 185 enters into the area 231 of the first optical sensor 230 (see also FIG. 14A). Afterwards, by inserting the cartridge 10*a* further into the accommodating casing 9, the second detection-objective portion 186 enters into the area 236 of the second optical sensor 235. At this time, the light from the light-emitting element 233 of the first optical sensor 230 passes through the clearance 190 (see FIG. 3) of the first detection-objective portion 185 and arrives at the light-receiving element 234.

Next, as shown in FIG. 17, when the cartridge 10*a* is inserted into up to the rearmost (innermost) portion of the accommodating casing 9 in a state that the front cover 31 is located at the first position at which the cover 31 is away from the cartridge body 30, then the projection 181 of the cartridge 10*a* is brought into contact with the contacting portion 226, and the front end of the second detection-objective portion 186 is brought into contact with the contacting portion 225, so that the front cover 31 cannot advance or enter further frontward. At this time, the first detection-objective portion 185 is positioned beyond the area 231 of the first optical sensor 230, and the cutout 187 enters into or exists in the area 231, instead of the clearance 190.

Then, when the lock lever 220 is pivoted from a position thereof shown in FIG. 17 in a direction for closing the opening 9*b*, then the inner surface of the lock lever 220 is brought into contact with the rear end of the cartridge 10*a*, thereby pressing the cartridge 10*a* frontward. This causes the cartridge body 30 and the rear cover 32 to move further frontward or enter further into the accommodating casing, which in turn causes the coil springs 23, 24 to contract to make the rear cover 32 approach closely to the front cover 31. In this entrance process, the ink supply opening 91 of the cartridge 10*a* is connected to the connecting portion 223, while the detection window 140 of the cartridge body 30 is moved frontward to be exposed in or via the cutout 187, and the detection window 140 enters into the area 231 of the first optical sensor 230.

As shown in FIG. 18, when the lock lever 220 completely closes the opening 9*b* and the engaging pawl 220*b* is fitted in the engaging groove 227, then the lock lever 220 is locked relative to the opening 9*b* and the opening 9*b* is completely closed and blocked by the lock lever 220. At this time, the cartridge body 30 is located at a second position at which the cartridge body 30 is closest to the front cover 31 (at which a distance between the cartridge body 30 and the front cover 31 is the shortest) and the valve body 87 of the air communication valve 80 is pushed and moved rearward by the push portion 174 of the front cover 31, thereby releasing or opening the inside of the ink chamber 100 to the atmosphere. As a result, the back pressure of the ink in the ink chamber 100 becomes equal to the atmospheric pressure, thereby allowing the ink to be supplied from the ink supply opening 91.

Figure 19:
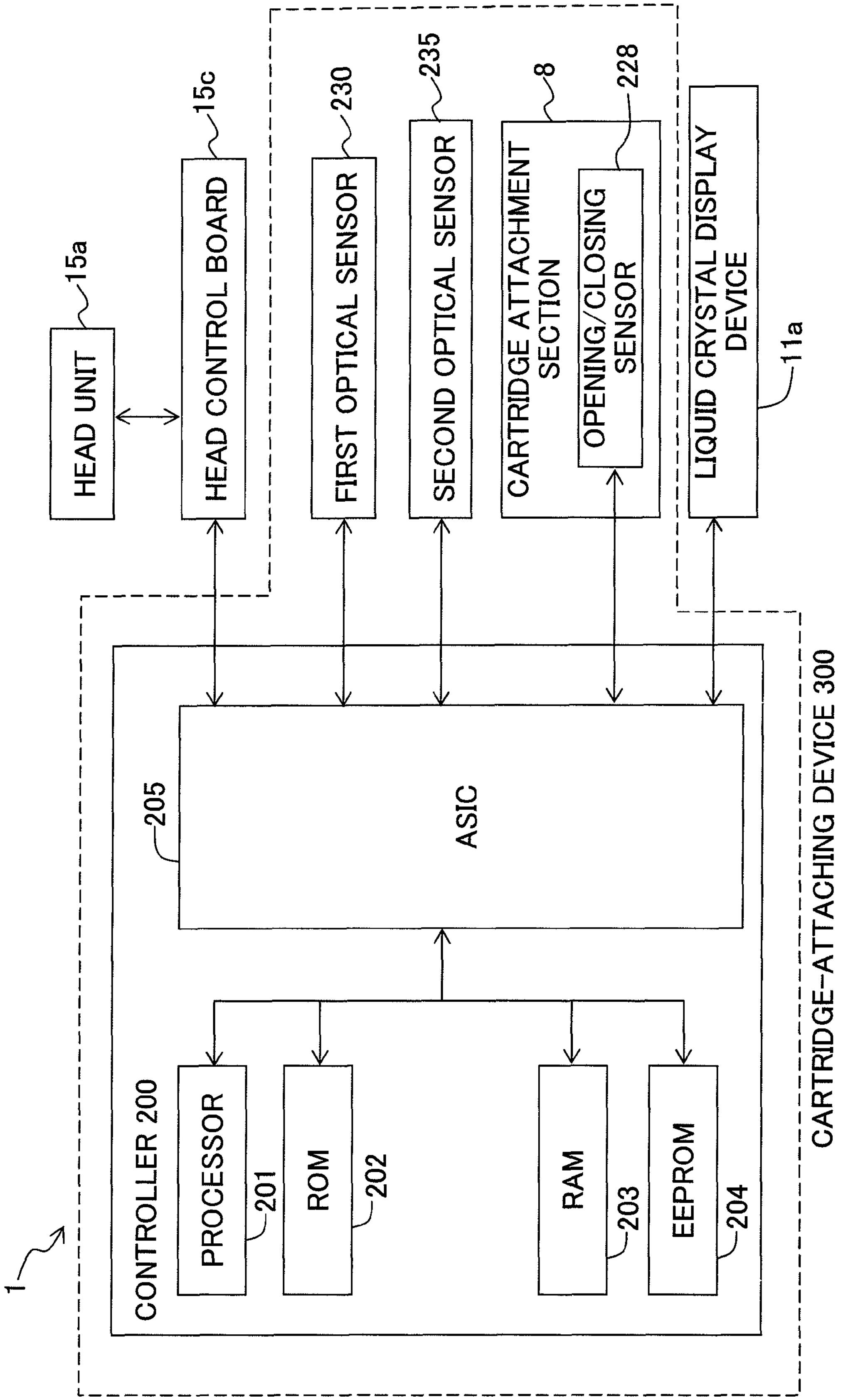
FIG. 19 is a block diagram showing main functions of the recording apparatus.

FIG. 19 is a block diagram showing main functions of the recording apparatus 1. As shown in FIG. 19, the recording apparatus 1 includes a controller 200 which controls all the operations of the recording apparatus 1. The controller 200 includes, as main components thereof, a processor 201, a ROM 202, a RAM 203, an EEPROM 204, and an Application Specific Integrated Circuit (ASIC) 205.

The ROM 202 stores programs required for the processor 201 to control various operation of the recording apparatus 1. The RAM 203 is used as a storage area for temporarily storing various data used when the processor 201 executes the programs, or as a working area used when the processor 201 executes the programs. The EEPROM 204 stores settings, flags, etc. to be stored or kept after the power of the recording apparatus 1 is turned off.

Further, the head control board 15*c*, the first optical sensors 230, the second optical sensors 235, the opening/closing sensor 228, the liquid crystal display 11*a*, etc. which are provided outside of (separately from) the controller 200, are connected to the ASIC 205. Note that although not shown in FIG. 19, in addition to these components, driving circuits for driving the paper feed roller 19, the pair of transport rollers 20, the pair of paper discharge rollers 21, etc. are also connected to the ASIC 205.

The head control board 15*c* is electrically connected to the head unit 15*a*, and drives the head unit 15*a* based on a signal inputted from the ASIC 205. As a result, the ink(s) of desired color(s) is or are selectively ejected from the nozzles of the head unit 15*a* at a specific timing, thereby recording an image and/or a letter on the recording paper.

The first optical sensor 230 outputs a signal (hereinafter referred to as a "light-receiving signal") according to intensity (amount) of the light received by the light-receiving element. Specifically, an analog electric signal (a voltage signal or a current signal), according to or corresponding to the intensity of the light emitted from the light-emitting element 233 and received by the light-receiving element 234 of the first optical sensor 230, is outputted from the first optical sensor 230 as the light-receiving signal. The outputted light-receiving signal is inputted to the controller 200. When the electric level (value of the voltage signal or value of the current signal) of the light-receiving signal is not less than a predetermined threshold Va (see FIG. 20), the controller 200 judges that the signal is a "LOW level" signal; on the other hand, when the electric level is less than the threshold Va, the controller 200 judges that the signal is a "HIGH level" signal. In this recording apparatus 1, the light-receiving signal is judged to be the HIGH level signal in a case that the light is shielded in the area 231 of the first optical sensor 230 and the electric level of the light-receiving signal is less than the threshold Va; and the light-receiving signal is judged to be the LOW level signal in a case that the light is not shielded in the area 231 of the first optical sensor 230 and the electric level of the light-receiving signal is not less than the threshold Va. Note that the threshold Va may be a fixed or predetermined value. Alternatively, different values may be used as the threshold Va such that, for example, the received signal is judged as the LOW level signal when the electric level of the received signal is not less than a threshold VH, and is judged as the HIGH level signal when the electric level of the received signal is less than a threshold VL.

The second optical sensor 235 is operated based on a principle that is same as the principle based on which the first optical sensor 230 is operated, and the second optical sensor 235 outputs a light-receiving signal according to the illuminance of the light (the light amount) received by the light-receiving element. Thus, any detailed explanation of the operation of the second optical sensor 235 is omitted. Note that although the second optical sensor 235 according to the embodiment judges whether the electric level of the received signal is the HIGH level or the LOW level with the threshold Va as the reference, in a similar manner with the first optical sensor 230 (see FIG. 20), the second optical sensor 235 may use a threshold different from that for the first optical sensor 230.

The opening/closing sensor 228 outputs a predetermined signal when the lock lever 220 is opened to a predetermined degree of the opening. This signal is inputted to the controller 200. Based on this signal, the controller 200 judges whether or not the lock lever 220 is opened. Further, based on a signal inputted from the ASIC 205, the liquid crystal display 11*a* outputs information, such as a character string and symbol marks, which is recognizable by the user.

In this embodiment, a cartridge-attaching device 300 capable of detecting information about the cartridge 10 and capable of detecting the degradation of the first and second optical sensors 230, 235 is constructed of the controller 200, the first optical sensors 230 and the second optical sensors 235 in the this image recording apparatus 1.

Figure 20:
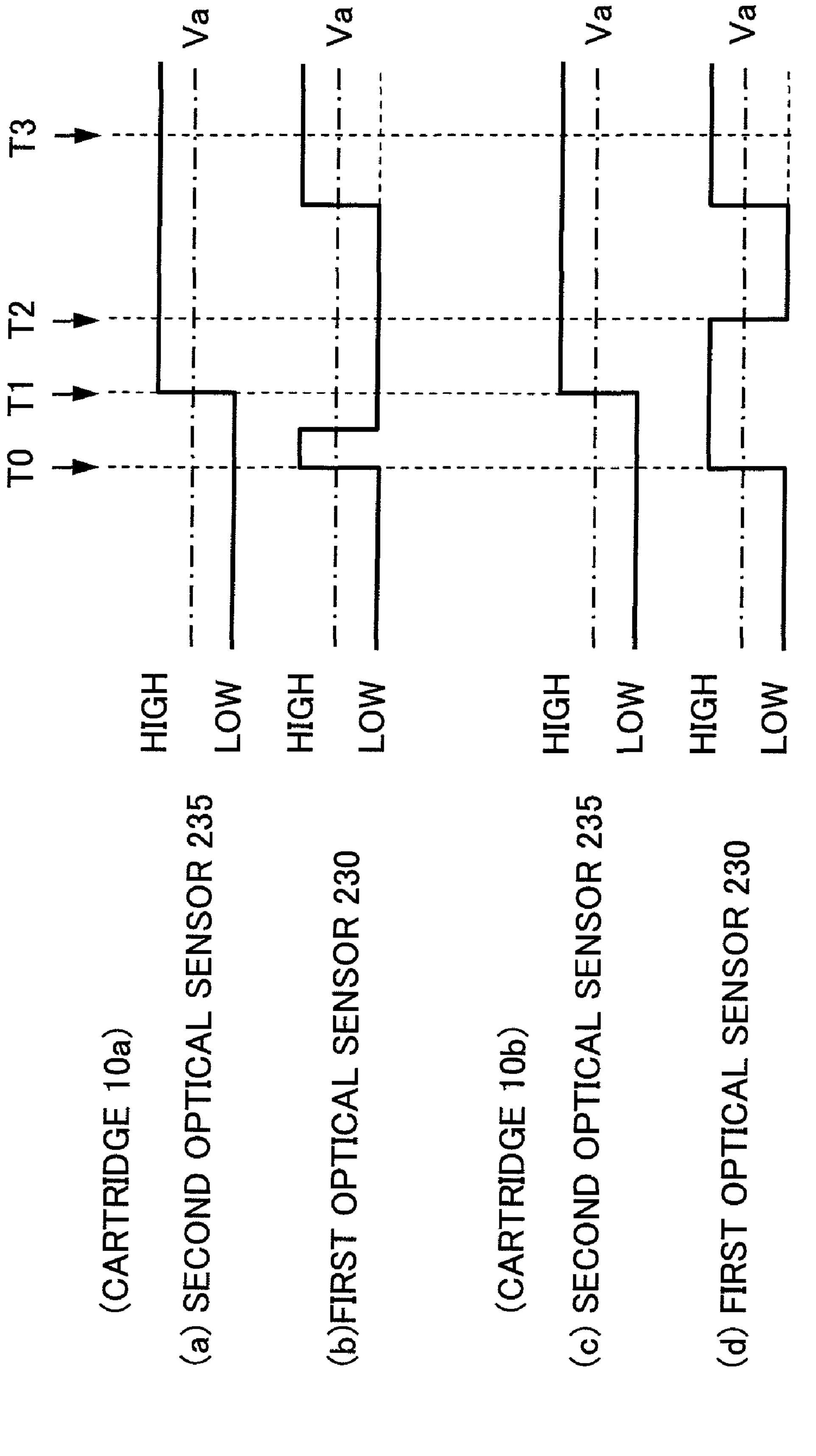
FIG. 20 is a view showing signal levels of light-receiving signals inputted into a controller from the first optical sensor and the second optical sensor, in which the changes in the waveforms are shown in a time series.

FIG. 20 is a view showing signal levels of light-receiving signals inputted into the controller 200 from the first optical sensor 230 and the second optical sensor 235, in which the changes in the waveforms are shown in a time series. In FIG. 20, portions (a) and (b) each show the change in the waveform (waveform change) when the cartridge 10*a* is attached. The portion (a) shows the waveform change of the light-receiving signal outputted from the second optical sensor 235, while the portion (b) shows the waveform change of the light-receiving signal outputted from the first optical sensor 230. In FIG. 20, portions (c) and (d) each show the waveform change when the cartridge 10*b* is attached. The portion (c) shows the waveform change of the light-receiving signal outputted from the second optical sensor 235, while the portion (d) shows the waveform change of the light-receiving signal outputted from the first optical sensor 230.

As shown in FIG. 20, even in a case that any one of the cartridges 10*a* and 10*b* is attached to the cartridge attachment section 8, the second optical sensor 235 outputs a light-receiving signal having a same waveform. Namely, when the second detection-objective portion 186 enters into the area 236 of the second optical sensor 235 to thereby shield the light, the signal level is changed from the LOW level to the HIGH level at time T1, and then, this state is maintained until the cartridge 10*a* (10*b*) is completely attached. Note that, in the controller 200, the change in the signal level, from the LOW level to the HIGH level, of the light-receiving signal outputted from the second optical sensor 235 is a trigger signal for starting a judging process (see FIG. 21) which will be described below.

On the other hand, the waveform of the light-receiving signal outputted from the first optical sensor 230 is different between a case that the cartridge 10*a* is attached to the cartridge attachment section 8 and a case that the cartridge 10*b* is attached to the cartridge attachment section 8.

First, the case that the cartridge 10*a* is attached to the cartridge attachment section 8 will be explained. In this case, the bridge portion 189 enters into the area 231 to thereby shield the light (at time T0 in the portion (b) shown in FIG. 20) in the attachment process of the cartridge 10*a*. At this time, the signal level of the signal outputted from the first optical sensor 230 is changed from the LOW level to the HIGH level. However, the bridge portion 189 is formed of a flat-plate-like member, and thus a time period during which the light is shielded by the bridge portion is relatively short. Therefore, in this embodiment, the bridge portion 189 is moved out of and away from the area 231 at least until arrival at time T1. Then, at the time T1, a state is provided that the clearance 190 (see FIG. 3) is in (enters into) the area 231. Thus, at the time T1, the signal level of the signal outputted from the first optical sensor 230 is returned from the HIGH level to the LOW level (see the portion (b) of FIG. 20).

Afterwards, when the cartridge 10*a* is inserted further into the back portion of the cartridge attachment section 8, the cutout 187 enters into the area 231. Then, when the cartridge 10*a* is fully attached to the cartridge attachment section 8 (in the state shown in FIG. 18), a state is provided that the cutout 187 and the detection window 140 are in (entered in) the area 231 (see time T3 in the portion (b) of FIG. 20). In this state, namely at the time T3, it is possible to detect the movement of the indicator portion 72 which enters into and retracts from (moves away from) the detection window 140. Note that in the portion (b) of FIG. 20, the signal level is shown by a solid line (the HIGH level) in a case that the indicator portion 72 is in the area 231 to thereby shield the light, while the signal level is shown by a broken line (the LOW level) in a case that the indicator portion 72 is out of and away from the area 231.

On the other hand, in a case that the cartridge 10*b* is attached to the cartridge attachment section 8, the bridge portion 199 enters into the area 231 to thereby shield the light (at the time T0 in the portion (d) of FIG. 20) in the attachment process of the cartridge 10*b*. At this time, the signal level of the signal outputted from the first optical sensor 230 is changed from the LOW level to the HIGH level. Here, in the cartridge 10*b*, since the bridge portion 199 has the side walls 198, time period during which the bridge portion 199 shields the light (light-shielding period) is longer than that of the bridge portion 189 of the cartridge 10*a*. In this embodiment, even at the arrival of the time T1 after the passing of time T0, the side walls 198 is maintained to be in the area 231. Thus, even at the time T1, the signal level of the signal outputted from the first optical sensor 230 is maintained to be the HIGH level (see the portion (d) of FIG. 20).

Afterward, when the cartridge 10*b* is inserted further into the back portion of the cartridge attachment section 8, then at the time T2, the side walls 198 is out of and away from the area 231, and the cutout 187 enters into the area 231 instead of the side walls 198. At this time, the signal level of the signal outputted from the first optical sensor 230 is returned from the HIGH level to the LOW level. Then, when the cartridge 10*b* is fully attached to the cartridge attachment section 8, there is provided a state that the cutout 187 and the detection window 140 are in the area 231 (see time T3 in the portion (d) of FIG. 20). In this state, namely at the time T3, it is possible to detect the movement of the indicator portion 72 which enters into and retracts from (moves away from) the detection window 140. Note that in the portion (d) of FIG. 20, the signal level is shown by a solid line (the HIGH level) in a case that the indicator portion 72 is in the area 231 and shields the light, while the signal level is shown by a broken line (the LOW level) in a case that the indicator portion 72 is out of the area 231.

As described above, the cartridges 10*a*, 10*b* are different from each other in that whether the return of the signal level of the light-receiving signal outputted from the first optical sensor 230 from the HIGH level to the LOW level occurs before or after the time T1 at which the light-receiving signal outputted from the second optical sensor 235 is changed from the LOW level to the HIGH level.

Figure 21:
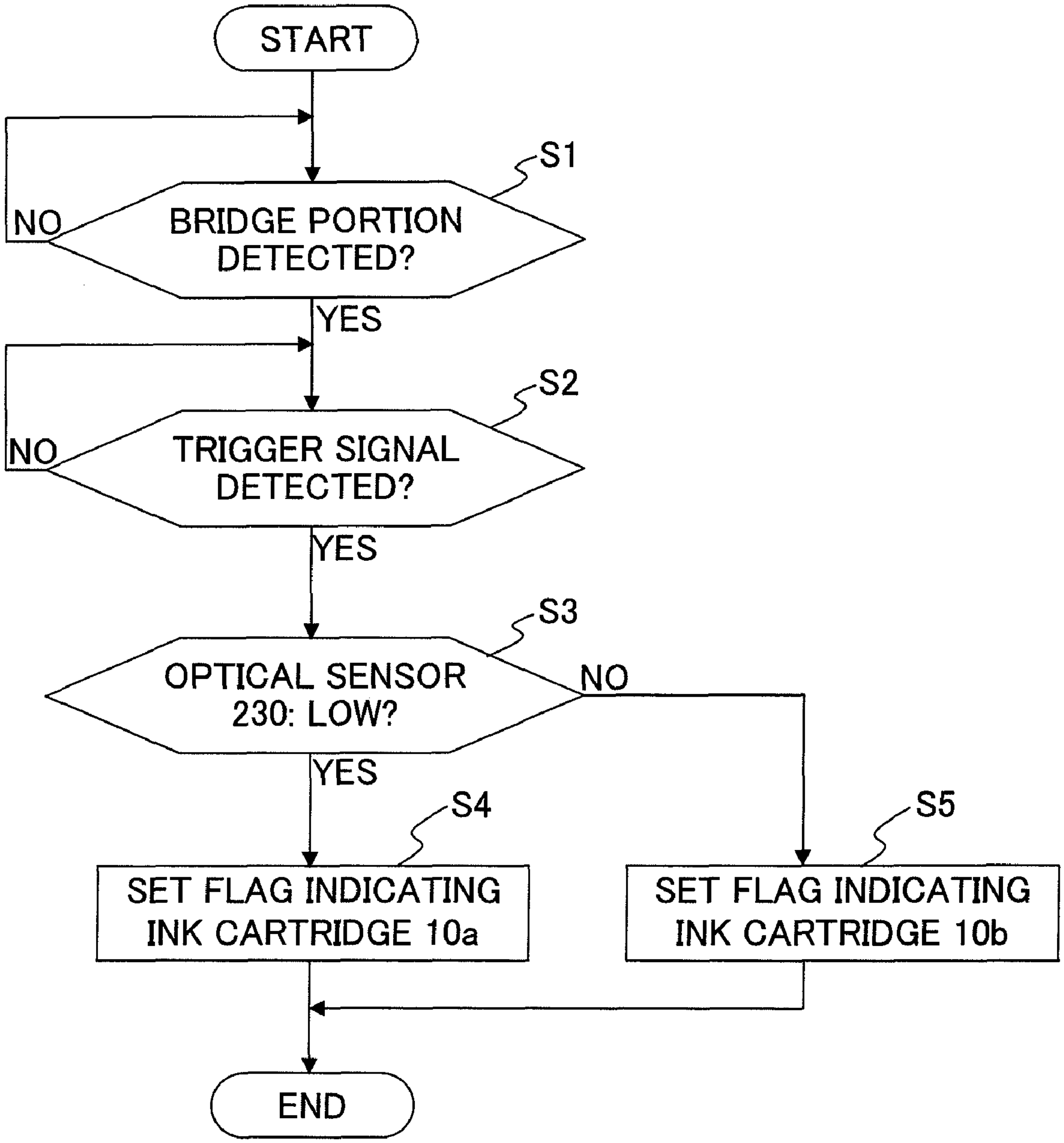
FIG. 21 is a flow-chart showing an example of a procedure of a cartridge-type judging process performed by the controller.

In this recording apparatus 1 according to the embodiment, it is possible to judge (discriminate) the type of the cartridge 10 attached to the cartridge attachment section 8, based on the light-receiving signals outputted from the first optical sensor 230 and the second optical sensor 235, respectively. FIG. 21 is a flow-chart showing an example of a procedure of cartridge-type judging process performed by the controller 200. In the following, an explanation will be given, with reference to FIG. 21, about the procedure of the judging process in which the type of the cartridge 10 is judged.

First, in step S1, the controller 200 judges whether or not the light is shielded at the area 231 of the first optical sensor 230. Specifically, the controller 200 makes this judgment in step S1, based on whether or not the signal level of the signal outputted from the first optical sensor 230 is changed from the LOW level to the HIGH level (see the portions (b) and (d) in FIG. 20). Here, when it is judged by the controller 200 that the light is shielded at the area 231 (S1: YES), then the processing goes to next step S2 for another judgment. Note that in this embodiment, unless it is judged at step S1 that the light is shielded at the area 231, the cartridge-type judging process of the cartridge 10 is not performed.

Next, in step S2, the controller 200 judges whether the above-described trigger signal is present or absent. That is, the controller 200 judges whether or not the signal level of the signal outputted from the second optical sensor 235 is changed from the LOW level to the HIGH level. When the trigger signal is detected in step S2, then in step S3, it is judged by the controller 200 whether or not the signal level of the signal outputted from the first optical sensor 230 is the LOW level or the HIGH level at the timing (i.e., at the time T1 in FIG. 20) at which the trigger signal is detected. For example, with reference to FIG. 20, in a case that the signal level is the LOW level at the time T1, it is possible to judge that the cartridge 10*a* is being attached to the cartridge attachment section 8. On the other hand, in a case that the signal level is the HIGH level at the time T1, it is possible to judge that the cartridge 10*b* is being attached to the cartridge attachment section 8.

In step S3, when it is judged that the signal level of the signal outputted from the first optical sensor 230 is the LOW level, then a bit flag indicating the cartridge 10*a* is set, for example, to a register of the processor 201, etc. On the other hand, when it is judged in step S3 that the signal level of the signal outputted from the first optical sensor 230 is the HIGH level, then a bit flag indicating the cartridge 10*b* is set to the register of the processor 201, etc. Note that the set bit flag is inputted, for example, to an information processing device (a personal computer) connected to the recording apparatus 1 via a network, the liquid crystal display 11*a* of the recording apparatus 1, etc.

As described above, in the recording apparatus 1 according to the embodiment, when the trigger signal is detected in the attachment process of the cartridge 10, the type of the cartridge 10 is judged based on the timing at which the signal level of the signal outputted from each of the first optical sensor 230 and the second optical sensor 235 is changed. Accordingly, it is possible to judge the type of the cartridge 10 assuredly and accurately, regardless of an operation speed of the user upon attaching the cartridge 10 to the cartridge attachment section 8.

The recording apparatus 1 according to the embodiment is constructed so that the degradation of the light-emitting element 233 included in each of the first and second optical sensors 230, 235 can be detected, in the cartridge-attaching device 300, in a state that the cartridge 10 is attached to the cartridge attachment section 8. Note that the judgment of degradation of the light-emitting element 233 needs not be performed all the time. For example, it is allowable to perform the judgment periodically in accordance with a timing at which ink purge is performed for forcibly discharging the ink inside the head unit 15*a* from the head unit 15*a* as waste or discarded liquid. In such a case, it is preferable to perform the degradation judgment (and the purge as well) at a frequency such as once a week, once a month, or the like. Alternatively, it is allowable to perform the degradation judgment at a timing at which the user exchanges the ink cartridge 10. In the following, an explanation will be given about the detection of the degradation (degradation detection) of the light-emitting element 233, with the first optical sensor 230 as an example. Note that the degradation detection can be performed also for the light-emitting element 233 of the second optical sensor 235, in a similar manner as that to be explained as follows.

Figure 22:
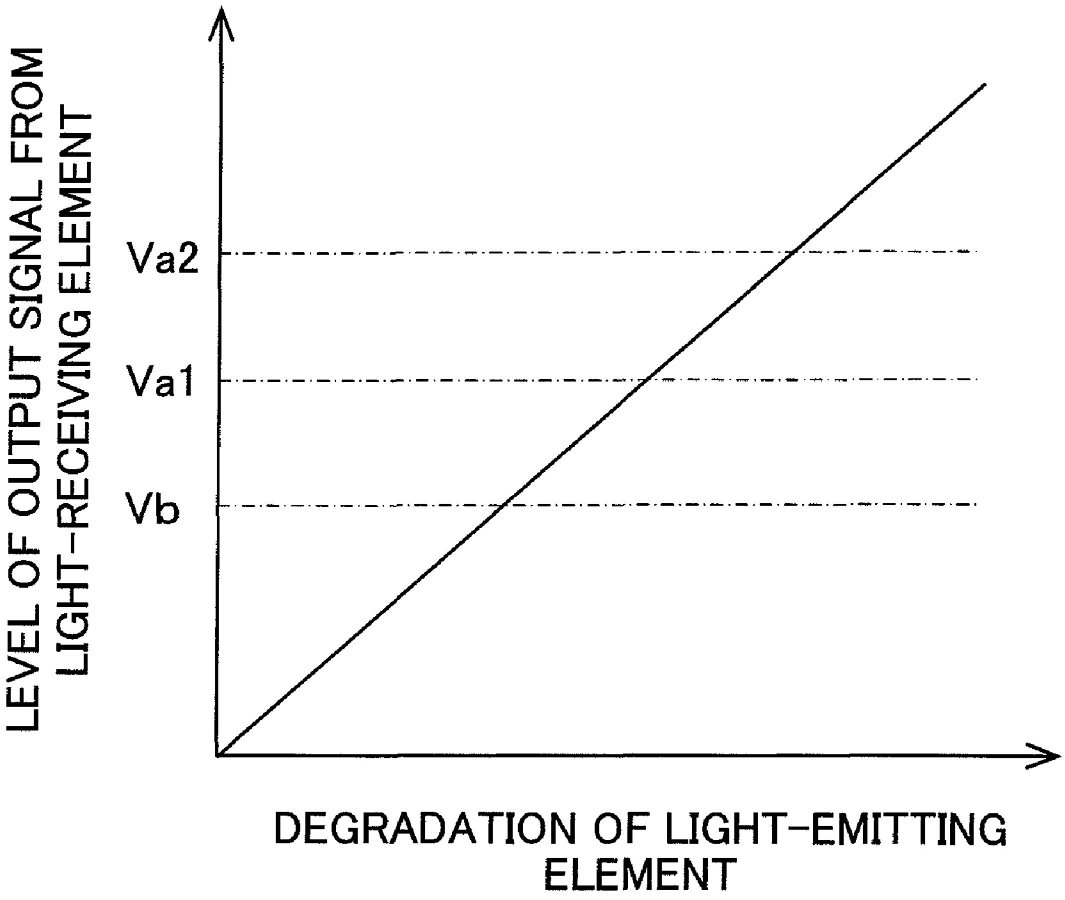
FIG. 22 is a graph showing a relationship between the degradation of light-emitting element and the output of light-receiving element.

FIG. 22 is a graph showing relationship between the degradation of the light-emitting element 233 and the output signal of the light-receiving element 234. Here, the horizontal axis of the graph shown in FIG. 22 indicates the progression of degradation wherein the degradation is progressed (advanced), from the origin point at which there is no degradation, in a direction indicated by an arrow; the vertical axis of the graph shows the level of the output signal wherein the signal level is increased (becomes higher) in a direction indicated by an arrow.

With respect to the two adjacent sensors 230*a*, 230*b* among the first optical sensors 230 which are shown in FIG. 15, in a state that any intervening object is not present between the light-receiving element 234 of one (first optical sensor 230*a*) of the two adjacent first optical sensors and the light-emitting element 233 of the other (first optical sensor 230*b*) of the two adjacent first optical sensors, and that the cartridge 10 is attached, the light emitted from the light-emitting element 233 of the first optical element 230*b* via the slit 242 thereof is received by the light-receiving element 234, via the slit 245, of the first optical element 230*a* which is adjacent to the first optical sensor 230*b*. The output signal, outputted from the light-receiving element 234 of the first optical sensor 230*a* as a result of the light-reception thereby, indicates the level in the vertical axis of the graph shown in FIG. 22. The output signal as the result of light-reception has a tendency that the signal level becomes higher in an obliquely rightward direction as the degradation of the light-emitting element 233 is progressed.

Further, in the embodiment, two thresholds Va (thresholds Va1, Va2) are set with respect to the output signal of the light-receiving element 234. These thresholds Va1 and Va2 are selectively chosen, as a reference threshold, for judging whether or not the output signal of the light-receiving element 234 is HIGH level or LOW level (see FIGS. 20 and 21), and are set to satisfy the relationship: Va1<Va2. In addition to these thresholds, a threshold Vb is set with respect to the output signal of the light-receiving element 234 to satisfy, in this embodiment, relationship: Vb<Va1. Note that the threshold Vb can be applied even if the relationship of Vb<Va1 is not satisfied.

Figure 23:
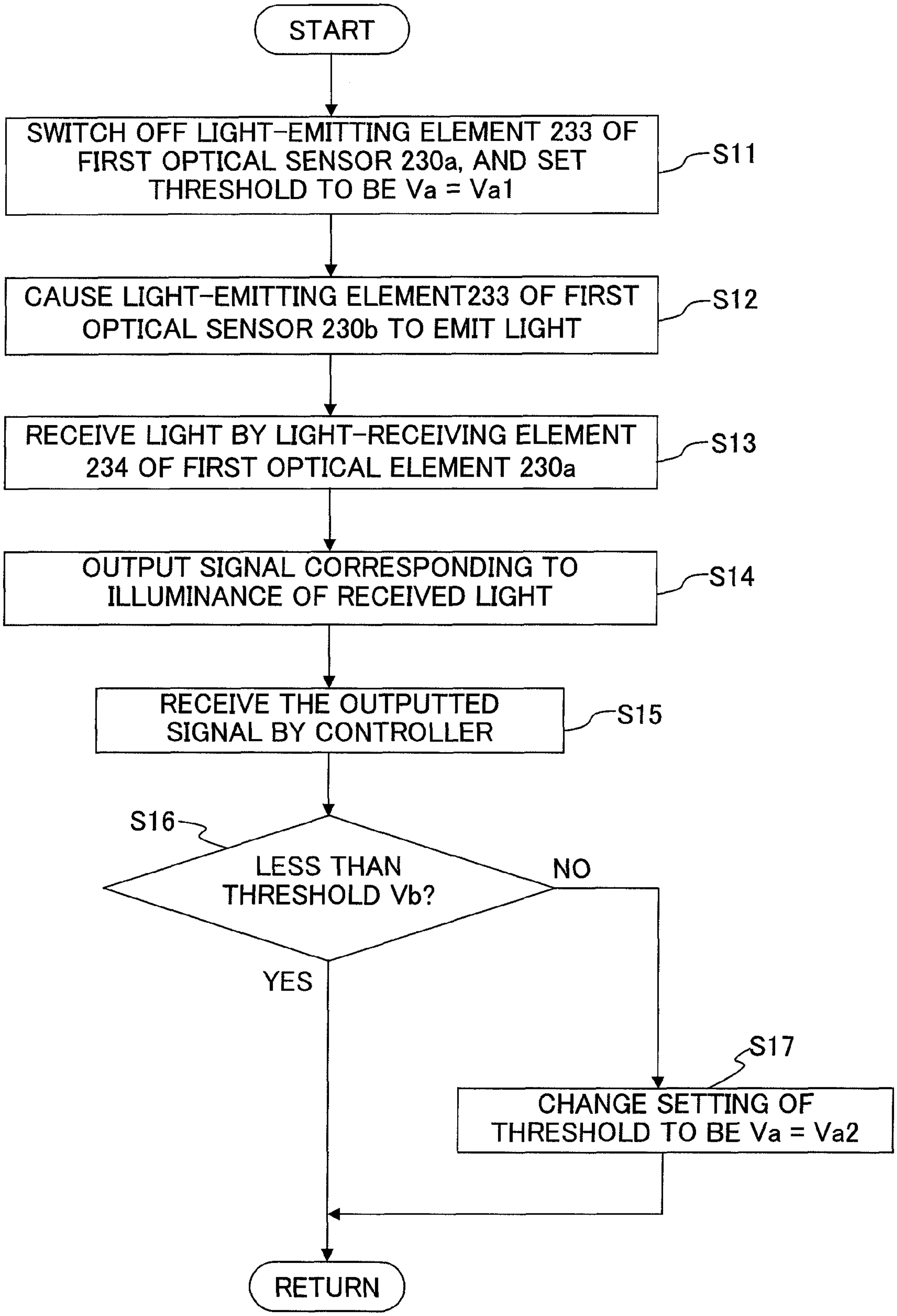
FIG. 23 is a flow-chart showing a procedure for judging the degradation of a light emitting element of the first optical sensor, and further a procedure for changing the setting of threshold based on the judged degradation.

FIG. 23 is an example of a flow chart showing the procedure performed by the controller 200 included in the cartridge-attaching device 300 for obtaining the information about the degradation of the light-emitting element 233 of the first optical sensor 230*b* and for changing the setting of the threshold Va for the output signal from the light-receiving element 234 of the first optical sensor 230*b*, based on the degradation of the light-emitting element 233 of the first optical sensor 230*b*. As shown in FIG. 23, before the first optical sensor 230*b*, as one of the first optical sensors, emits the light, the controller 200 makes the first optical sensor 230*a*, as the other of the first optical sensors, to be in a state that the light-emitting element 233 of the first optical sensor 230*a* does not emit the light (in a OFF state) and the controller 200 sets the threshold Va to be Va1 (Va=Va1) for the light-receiving element 234 of the first optical sensor 230*b* (Step S11). The reason (purpose) that the light-emitting element 233 of the first optical sensor 230*a* is made to be in the OFF state is to judge whether the light received by the light-receiving element 234 of the first optical sensor 230*a* is the light emitted from the light-emitting element 233 of the first optical sensor 230*a* or of the first optical sensor 230*b*; in other words, the reason is to distinguish (discriminate) that the light received by the light-receiving element 234 of the first optical sensor 230*a* is the light emitted from the light-emitting element 233 of the first optical sensor 230*b* which is adjacent to the first optical sensor 230*a*.

When the light-emitting element 233 of the first optical sensor 230*b* (as the one first optical sensor) is made to emit the light (step S12), the emitted light is received by the light-receiving element 234 of the first optical sensor 230*a* (as the other first optical sensor) via the slits 242 and 245 (step S13); and the light-receiving element 234 outputs a signal having a level (signal level) corresponding to the illuminance of the received light (step S14). The controller 200 of the cartridge-attaching device 300 receives this outputted signal (step S15), and judges whether or not the level of the signal is less than the threshold Vb (step S16). As the result of judgment, when the controller 200 judges that the level of the signal is less than the threshold Vb (step S16: YES), then the operation is repeated again from Step S11 after a predetermined period of the time lapses or at another predetermined time interval (timing). Further, in the detection of information about the cartridge 10 (see FIGS. 20 and 21) which is performed during a time period after the judgment performed in step S16 and before the operation of Step S11 is started again, the threshold Va is maintained as Va=Va1, and the judgment is made whether the signal level is HIGH or LOW. Note that in the judgment in step S16, the state that the signal level is less than the threshold Vb means a state that the illuminance of the light from the light-emitting element 233 of the first optical sensor 230*b* is relatively high and thus the degradation of the light-emitting element 233 of the first optical sensor 230*b* has not advanced much.

On the other hand, when it is judged in step S16 that the signal level is not less than the threshold Vb (step S16: NO), then it is judged that the degradation of the light-emitting element 233 of the first optical sensor 230*b* has advanced to some extent (the illuminance has lowered to some extent), and the setting of the threshold Va is changed, for the output signal from the light-receiving element 234 of the first optical sensor 230*b*, to be Va2 (Va=Va2) (step S17). Then, after the predetermined time is elapsed, or at another predetermined timing, the operation from the step S11 is repeated again. Accordingly, during a time period after the setting of the threshold is changed in step S17 to the operation of step S11 is started again, the detection of the information about the cartridge 10 is performed in a state that the threshold Va is set to be "Va2" which is higher level than "Va1". Namely, depending on the lowering of the illuminance of the light emitted by the light-emitting element 233 of the first optical sensor 230*b*, the setting of the threshold Va for the light-receiving element 234 of the first optical sensor 230*b* is also changed so as to correspond to a lower illuminance. Thus, by judging the signal from the light-receiving element 234 of the first optical sensor 230*b* based on the threshold Va2 of which setting is changed in such a manner, it is possible to appropriately judge whether the signal level is HIGH or LOW.

Note in the above explanation, although the operation from step S11 is performed again after the setting is changed in step S17, it is also allowable that the degradation of the light-emitting element 233 is not detected and that the setting of the threshold Va is fixed as Va=Va2. However, in a case that the operation from the step S11 is repeated a plurality of times, it is advantageous to perform the degradation of the light-emitting element 233 because even if, for example, the optical path of the light is shielded by any foreign matter flying or floating in the area 246 (see FIG. 15) to thereby cause any error in the judgment performed in the step S16, such error can be corrected by the judgment performed next time in the step S16. Further, it is allowable that the threshold Va is not limited to the two thresholds of Va1 and Va2, and may be set among three or more thresholds for the threshold Va. In a case three or more thresholds are set for the threshold Va, then three or more thresholds Vb may also be provided corresponding thereto.

As explained above, according to the cartridge-attaching device 300 provided on the recording apparatus 1 according to the embodiment, it is possible to detect the degradation of the light-emitting element 233 even in a state that the cartridge 10 is attached to the cartridge attachment section 8. Further, it is possible to change, depending on the state (degree) of the degradation, the setting of the threshold Va based on which the signal level of the signal from the light-receiving element 234 is judged, thereby making it possible to judge the signal level appropriately.

Figure 24:
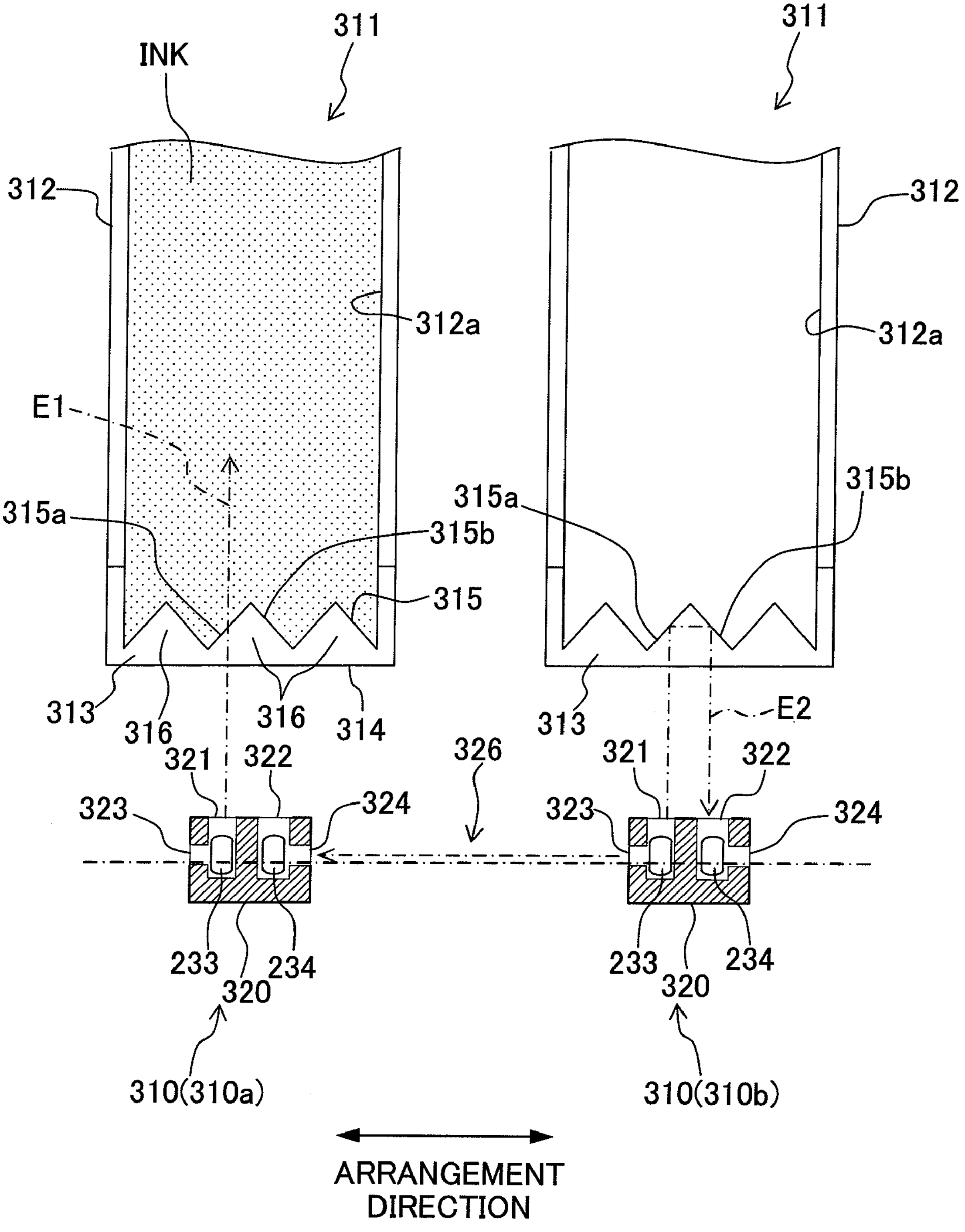
FIG. 24 is a plane view schematically showing a construction including a reflection type optical sensor and a cartridge which are applicable to the recording apparatus.

In the foregoing explanation, a case of adopting light-transmission type optical sensors as the first optical sensor 230 and the second optical sensor 235. However, it is possible to adopt, in place of the light-transmission type optical sensor, a reflection type optical sensor to detect the degradation in a similar manner. FIG. 24 is a plane view schematically showing a construction including a cartridge 311 and a reflection type optical sensor 310 applicable to the recording apparatus 1.

As shown in FIG. 24, the cartridge 311 includes an ink case 312 which is a hollow box defining an ink chamber 312*a* inside the ink case 312. The ink case 312 has a side wall 313 which faces the reflection type optical sensor 310 in a state that the cartridge 311 is attached to the cartridge attaching section 8. The side wall 313 has an outer surface 314 which faces the reflection type optical sensor 310 and which is made to be flat, and an inner surface 315 which makes contact with the ink and which is formed to be non-flat (concavo-convex) with inclined surfaces 315*a* and 315*b* inclined with respect to the outer surface 314 at two different inclination angles, respectively. More precisely, a portion, of the side wall 313, on a side of the ink chamber 312*a* has a construction in which a plurality of prisms 316 of which cross-section is trianglular, and in which two faces of each of the prisms 316 on the side of the ink chamber 312*a* forms the inclined surfaces 315*a* and 315*b*. Further, the side wall 313 is formed of a light-transmissive material having a refractive index which is similar to that of the ink.

On the other hand, the reflection type optical sensor 310, which is arranged to face the outer surface 314 of the cartridge 311, has a sensor case 320 having a rectangular parallelepiped shape. The reflection type optical sensor 310 accommodates, in this sensor case 320, a light-emitting element 233 and a light-receiving element 234 which pair with each other (which constructs a pair of the light-emitting and light-receiving elements). Five pieces of the reflection type optical sensor 310 are arranged corresponding to the cartridges 311 for the five color inks, respectively. Note that FIG. 24 shows, as two pieces among these five reflection type optical sensors 310, reflection type optical sensors 310*a* and 310*b* which are adjacent to each other. The reflection type optical sensors 310 are arranged such that the light-emitting element 233 and the light-receiving element 234 of each of the reflection type optical sensors 310 are arranged on a same axis (see the dashed-dotted line shown in FIG. 24); and that the two reflection type optical sensors 310 (310*a* and 310*b*), which are adjacent to each other, are arranged such that the light-receiving element 234 of the reflection type optical sensor 310*a* as one of the two adjacent optical sensors is adjacent to the light-emitting element 233 of the reflection type optical sensor 310*b* as the other of the two adjacent optical sensors.

Further, the sensor case 320 of each of the reflection type optical sensors 310 has two slits, namely a light-transmissive slit 321 for light emission and a light-transmissive slit 322 for light reception. The slits 321 and 322 penetrate through a side wall of the sensor case 320 to be open in a direction orthogonal to the arrangement direction (see an arrow in FIG. 24) in which the elements 233 and 234 are arranged. The light from the light-emitting element 233 is irradiated, via the slit 321 as one of the two slits, toward the side wall 313 of the cartridge 311; and a reflect light from the side wall 313 of the cartridge 311 comes into the light-receiving element 234 via the slit 322 as the other of the two slits.

Moreover, the sensor case 320 further has another two slits, namely a light-transmissive slit 323 for light emission and a light-transmissive slit 324 for light reception. The slits 323 and 324 penetrate through side walls of the sensor case 320, respectively, to be open in the arrangement direction in which the elements 233 and 234 are arranged. These slits 233 and 234 are open in mutually opposite direction toward the outside of the sensor case 320. The light emitted from the light-emitting element 233 via the slit 323, in one (for example, the reflective type optical sensor 310*b*) of the reflective type optical sensors 310 adjacent to each other, passes an area 326 in which any intervening object does not exist, and comes into the light-receiving element 234 of the other (for example, the reflective type optical sensor 310*a*) of the two adjacent reflection type optical sensors 310, via the slit 324 provided on the other reflection type optical sensor 310.

Accordingly, it is possible to detect the degradation state of the light-emitting element 233 included in the one reflection type optical sensor 310 (310*b*) by detecting the signal level of the signal outputted from the light-receiving element 234 included in the other reflection type optical sensor 310 (310*a*) adjacent to the one reflection type optical sensor 310 (310*b*). Since the judgment procedure of the degradation state is same as that explained above regarding the first optical sensor 230 that is a light-transmission type optical sensor, any explanation therefore will be omitted.

It is possible to detect the ink remaining amount also in the reflection type optical sensor 310 and the cartridge 311 as describe above, as follows. Namely, when the ink remaining amount is not less than a predetermined amount (state of the cartridge 311 facing the reflection type optical sensor 310*a* in FIG. 24), the cartridge 311 is in a state that the ink exists on a side of the inner surface 315 of the side wall 313 of the ink case 312. At this time, since the side wall 313 of the ink case 312 of the cartridge 311 has the refractive index same as that of the ink, the light emitted from the light-emitting element 233 via the slit 321 advances along a locus (trajectory) E1 shown in FIG. 24, and enters into the ink chamber 312*a* while hardly refracted on the inner surface 315 of the side wall 313. As a result, the light is hardly received by the light-receiving element 234, and the light-receiving element 234 outputs a signal of which level is HIGH.

On the other hand, when the ink remaining amount is less than the predetermined amount (state of the cartridge 311 facing the reflection type optical sensor 310*b* in FIG. 24), the cartridge 311 is in a state that the ink does not exist on the side of the inner surface 315 of the side wall 313 of the ink case 312. At this time, the light emitted from the light-emitting element 233 via the slit 321 advances along a locus (trajectory) E2 shown in FIG. 24, namely is refracted on the inner surface 315 of the side wall 313, and then comes into the light-receiving element 234 via the slit 322. As a result, the light-receiving element 234 outputs a signal of which level is LOW. In such a manner, it is possible to detect the ink remaining amount also in the reflection type optical sensor 310 by comparing the level of the output signal from the light-receiving element 234 with the threshold.

Since such detection of ink-remaining amount by using the reflection type optical sensor 310 is explained in detail in, for example, U.S. Pat. Nos. 6,619,776 and 6,916,076 corresponding to Japanese patent application Laid-open No. 2002-292892 (Applicant: BROTHER KOGYO KABUSHIKI KAISHA), the contents thereof is herein incorporated by reference, and any detailed explanation therefore will be omitted.

Figure 25:
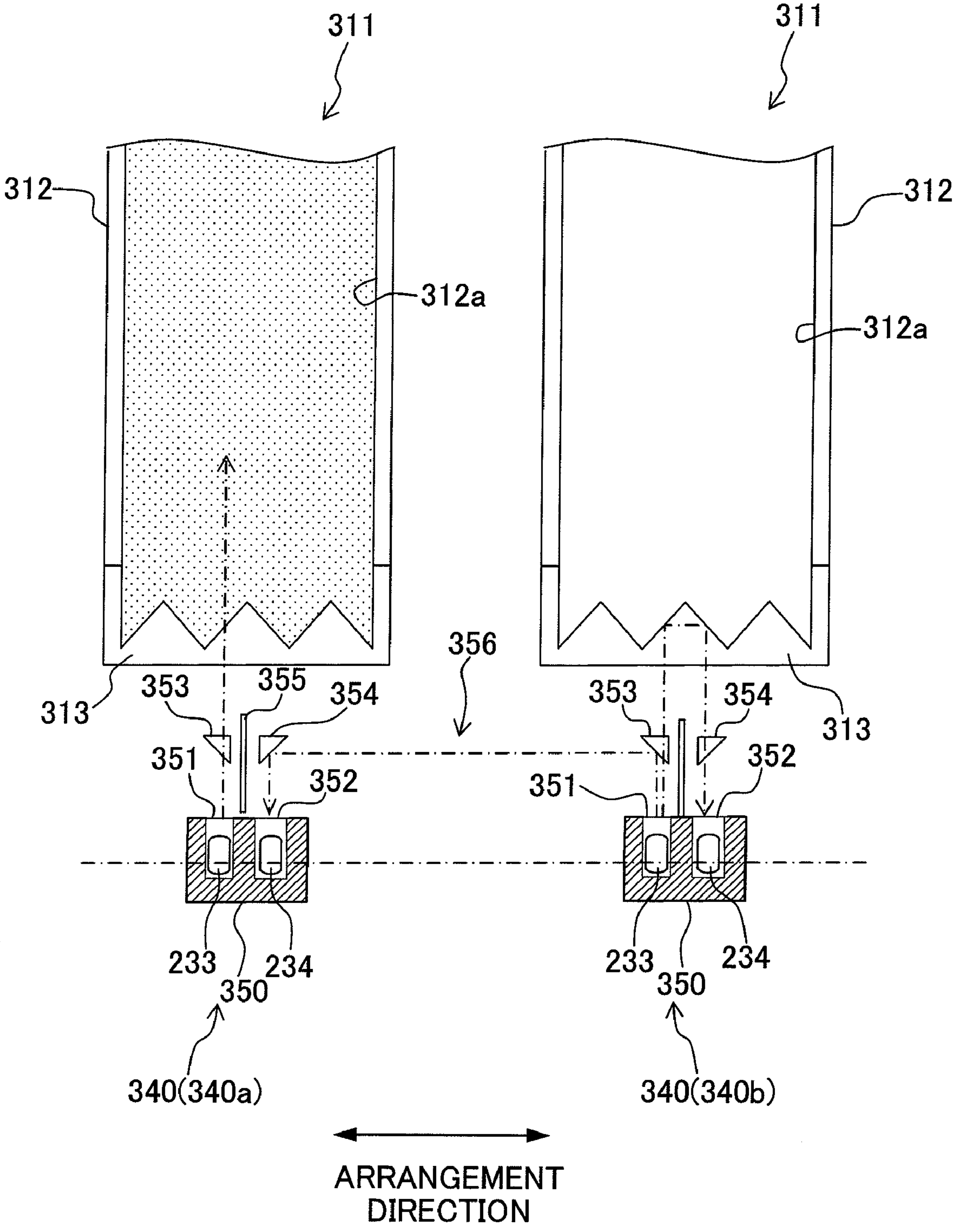
FIG. 25 is a plane view schematically showing a construction including another reflection type optical sensor and a cartridge which are applicable to the recording apparatus.

Next, an explanation will be given about another example using the reflection type optical sensor. FIG. 25 is a plane view schematically showing a construction including a cartridge 311 and a reflection type optical sensor 340 applicable to the recording apparatus 1. Note that since the cartridge 311 has a construction same as that of those shown in FIG. 24, same reference numerals are affixed to the corresponding parts or components, and any detailed explanation therefor will be omitted.

As shown in FIG. 25, the reflection type optical sensor 340 has a sensor case 350 having a rectangular parallelepiped shape. The reflection type optical sensor 340 accommodates, in this sensor case 350, a light-emitting element 233 and a light-receiving element 234 which pair with each other. Five pieces of the reflection type optical sensor 340 are arranged corresponding to the cartridges 311 for the five color inks, respectively. Note that FIG. 25 shows, two pieces among these five reflection type optical sensors 310, namely reflection type optical sensors 340*a* and 340*b* which are adjacent to each other. The reflection type optical sensors 340 are arranged such that the light-emitting element 233 and the light-receiving element 234 of each of the reflection type optical sensors 340 are arranged on a same axis (see a dashed-dotted line shown in FIG. 25); and that the two reflection type optical sensors 340 (340*a* and 340*b*), which are adjacent to each other, are arranged such that the light-receiving element 234 of the reflection type optical sensor 340*a* as one of the two adjacent optical sensors is adjacent to the light-emitting element 233 of the reflection type optical sensor 340*b* as the other of the two adjacent optical sensors.

Further, the sensor case 350 of each of the reflection type optical sensors 340 has two slits, namely a light-transmissive slit 351 for light emission and a light-transmissive slit 352 for light reception. The slits 351 and 352 penetrate through a side wall of the sensor case 350 to be open in a direction orthogonal to the arrangement direction (see an arrow in FIG. 25) in which the elements 233 and 234 are arranged. Further, the reflection type optical sensor 340 is provided with a half mirror 353 and a half mirror 354 which are arranged between the reflection type optical sensor 340 and the cartridge 311, at a position at which the half mirrors 353 and 354 face the openings of the slits 351 and 352, respectively. Further, a light shielding plate 355 is arranged between the half mirrors 353 and 354.

Among these mirrors 353 and 354, the half mirror 353 which corresponds to the light-transmissive slit 351 for the light emission allows approximately a half portion of the light emitted from the light-emitting element 233 to pass through the half mirror 353 toward the cartridge 311 and reflects the remaining half portion of the emitted light so that the reflected light (reflected light portion) bends in a direction opposite to the direction of the light-receiving element 234 with which the light-emitting element 233 pairs, substantially at the right angle (namely, substantially in the arrangement direction). Further, the light-transmissive half mirror 352 for the light reception allows the light from the side of the cartridge 311 pass straight therethrough such that the transmitted light can be received by the light-receiving element 234 via the slit 352; and the light-transmissive half mirror 352 bends another light, coming into the half mirror 354 in the arrangement direction from a side opposite to the light-emitting element 233 with which the light-receiving element 234 pairs, such that this light can also be received by the light-receiving element 234 via the slit 352. Further, an area between the light-transmissive half mirror 354 for the light reception of one of the adjacent reflection type optical sensor (reflection type optical sensor 340*a*) and the light-transmissive half mirror 353 for the light emission of the other of the adjacent reflection type optical sensor (reflection type optical sensor 340*b*) defines an area 356 in which any intervening object does not exist.

Moreover, the light shielding plate 355 arranged between the two half mirror 353, 354 is formed of a material which does not allow light pass therethrough; and the light shielding plate 355 shields a light portion which is included in the light coming into the light-transmissive half mirror 354 for the light reception in the arrangement direction as described above and which is transmitted through the other half mirror 353 of the adjacent reflection type optical sensor in the arrangement direction, so that this light portion does not arrive at the half mirror 353 with which the half mirror 354 pairs.

Also in the reflection type optical sensor 340 as described above, about a half portion of the light from the light-emitting element 233 is received, via the side wall 313 of the cartridge 311, by the light-receiving element 234 with which the light-emitting element 233 pairs, in a similar manner as that with the reflection type optical sensor 310 shown in FIG. 24. Accordingly, it is possible to detect the ink remaining amount in the cartridge 311 also by comparing the level of the output signal from the light-receiving element 234 with the threshold.

On the other hand, the remaining half portion of the light from the light-emitting element 233 constructing one pair passes through the area 356 in which any intervening object does not exist; and the remaining half portion of the light is received, via the half mirrors 353 and 354, by the light-receiving element 234 which is adjacent to the light-emitting element 233 of the one pair and which constructs another pair with another light-emitting element 233. Accordingly, regarding the reflection type optical sensors 340 also, it is possible to detect the degradation of the light-emitting element 233 in a similar manner as that explained regarding the first optical sensor 230 and the second optical sensor 235 which are the light-transmission type optical sensors as described above and the reflection type optical sensor 310 as described above.

The embodiment as described above is an example that the present invention is applied to the ink cartridge attachment device of an ink-jet recording apparatus. However, apparatuses to which the present invention is applicable are not limited to the ink cartridge attachment device of the ink-jet recording apparatus. The present invention is applicable to any apparatus jetting a liquid which is different from the ink and which is stored in a cartridge, if there is need for such apparatus to correctly detect the degradation of optical sensor which detects information about the cartridge even when the cartridge storing the liquid is attached to the cartridge attachment section. For example, the present invention is applicable to a printing apparatus which produces a DNA chip by using a liquid in which DNA is dispersed, a printing apparatus which produces a color filter for a liquid crystal display by using a liquid in which a pigment for color filter is dispersed, and the like.

What is claimed is:

1. An ink cartridge-attaching device, comprising:

a cartridge attachment section to which a plurality of cartridges each storing an ink are attachable;

a plurality of optical sensors which are provided on the cartridge attachment section, which detect the cartridges attached to the cartridge attachment section respectively, and which have light-emitting portions and light-receiving portions, each of the optical sensors having a light-emitting portion of the light-emitting portions and a light-receiving portion of the light-receiving portions; and a controller which controls the optical sensors to obtain, based on signals from the optical sensors, information about the cartridges;

wherein the optical sensors are disposed such that the light-emitting portions and the light-receiving portions are arranged alternately in a row;

the light-emitting portion of each of the optical sensors includes a light-emitting element and a light emitting element-case, the light emitting element-case accommodating the light-emitting element therein and having a first light-emission hole and a second light-emission hole formed therein;

the light-receiving portion of each of the optical sensors includes a light-receiving element and a light receiving element-case, the light-receiving element-case accommodating the light-receiving element and having a first light-reception hole and a second light-reception hole formed therein;

light emitted from a light-emitting portion included in a certain optical sensor among the plurality of optical sensors is received by a light-receiving portion included in the certain optical sensor and received by another light-receiving portion adjacent to the light-emitting portion and included in another optical sensor, among the plurality of optical sensors, adjacent to the certain optical sensor;

the controller obtains information about a cartridge, among the plurality of cartridges, detected by the certain optical sensor based on a signal which the light-receiving portion of the certain optical sensor outputs by receiving the light from the first light-emission hole of the light-emitting portion of the certain optical sensor through the first light-reception hole of the light-receiving portion of the certain optical sensor; and the controller obtains information about degradation of another light-emitting portion included in still another optical sensor adjacent to the certain optical sensor and adjacent to the light-receiving portion, based on a signal which the light-receiving portion of the certain optical sensor outputs by receiving the light from the second light-emission hole of the another light-emitting portion of the still another optical sensor through the second light-reception hole of the light-receiving portion of the certain optical sensor, wherein the light receiving element-case is configured, such that light entering the light receiving element-case from the first light-reception hole travels in a first direction toward the light-receiving element and another light entering the light receiving element-case from the second light-reception hole travels in a second direction, which is different from the first direction, toward the light-receiving element.

2. The ink cartridge-attaching device according to claim 1, wherein the cartridge attachment section has areas between adjacent optical sensors, to which the cartridges are not attached.

3. The ink cartridge-attaching device according to claim 1, wherein the controller controls the optical sensors such that the another light-emitting portion of the still another optical sensor is allowed to emit the light in a state that the light-emitting portion of the certain optical sensor is inhibited to emit the light.

4. An ink jet recording apparatus which jets liquid droplets of ink and records images on a recording medium, comprising:

an ink jet head which jets liquid droplets of ink;

a recording medium transporting mechanism which transports the recording medium; and the ink cartridge-attaching device as defined in claim 1.

5. An ink cartridge-attaching device, comprising:

a cartridge attachment section to which a plurality of cartridges each storing an ink are attachable;

a plurality of optical sensors which are provided on the cartridge attachment section, which detect the cartridges attached to the cartridge attachment section respectively, and which have light-emitting portions and light-receiving portions, each of the optical sensors having a light-emitting portion of the light-emitting portions and a light-receiving portion of the light-receiving portions; and a controller which controls the optical sensors to obtain, based on signals from the optical sensors, information about the cartridges;

wherein the optical sensors are disposed such that the light-emitting portions and the light-receiving portions are arranged alternately in a row;

light emitted from a light-emitting portion included in a certain optical sensor among the plurality of optical sensors is received by a light-receiving portion included in the certain optical sensor and received by another light-receiving portion adjacent to the light-emitting portion and included in another optical sensor, among the plurality of optical sensors, adjacent to the certain optical sensor;

the controller obtains information about a cartridge, among the plurality of cartridges, detected by the certain optical sensor based on a signal which the light-receiving portion of the certain optical sensor outputs by receiving the light from the light-emitting portion of the certain optical sensor;

the controller obtains information about degradation of another light-emitting portion included in still another optical sensor adjacent to the certain optical sensor and adjacent to the light-receiving portion, based on a signal which the light-receiving portion of the certain optical sensor outputs by receiving the light from the another light-emitting portion;

the light-emitting portion of each of the optical sensors includes a light-emitting element and a light emitting element-case which accommodates the light-emitting element;

the light-receiving portion of each of the optical sensors includes a light-receiving element and a light receiving element-case which accommodates the light-receiving element;

the light-emitting portion of the certain optical sensor has a first light-emission hole and a second light-emission hole which are formed in the light emitting element-case, the first light-emission hole being open toward the light-receiving portion of the certain optical sensor, and the second light-emission hole being open toward the another light-receiving portion of the another optical sensor; and the light-receiving portion has a first light-reception hole and a second light-reception hole which are formed in the light receiving element-case, the first light-reception hole being open toward the light-emitting portion of the certain optical sensor, and the second light-emission hole being open toward the another light-emitting portion of the still another optical sensor.

6. The ink cartridge-attaching device according to claim 5, wherein the optical sensors are light-transmission type optical sensors; each of the cartridges attached to the cartridge-attachment section is sandwiched between the light-emitting portion and the light-receiving portion of one of the optical sensors; and the first and second light-emission holes and the first and second light-reception holes are open in an arrangement direction of the light-emitting portion and the light-receiving portion, and are arranged on a same axis in the arrangement direction.

7. An ink cartridge-attaching device, comprising:

a cartridge attachment section to which a plurality of cartridges each storing an ink are attachable;

a plurality of optical sensors which are provided on the cartridge attachment section, which detect the cartridges attached to the cartridge attachment section respectively, and which have light-emitting portions and light-receiving portions, each of the optical sensors having a light-emitting portion of the light-emitting portions and a light-receiving portion of the light-receiving portions; and a controller which controls the optical sensors to obtain, based on signals from the optical sensors, information about the cartridges;

wherein the optical sensors are disposed such that the light-emitting portions and the light-receiving portions are arranged alternately in a row;

light emitted from a light-emitting portion included in a certain optical sensor among the optical sensors is received by a light-receiving portion included in the certain optical sensor and received by another light-receiving portion adjacent to the light-emitting portion and included in another optical sensor, among the optical sensors, adjacent to the certain optical sensor;

the controller obtains information about a cartridge, among the cartridges, detected by the certain optical sensor based on a signal which the light-receiving portion of the certain optical sensor outputs by receiving the light from the light-emitting portion of the certain optical sensor;

the controller obtains information about degradation of another light-emitting portion included in still another optical sensor adjacent to the certain optical sensor and adjacent to the light-receiving portion, based on a signal which the light-receiving portion of the certain optical sensor outputs by receiving the light from the another light-emitting portion;

the controller obtains the information about the cartridge detected by the certain optical sensor by comparing, with a predetermined threshold for the certain optical sensor, the signal which the light-receiving portion of the certain optical sensor outputs by receiving the light from the light-emitting portion of the certain optical sensor; and the controller changes setting of threshold for the still another optical sensor based on information about degradation of the another light-emitting portion of the still another optical sensor.

* * * * *